(12) United States Patent  (10) Patent No.: US 8,089,152 B2
Miller  (45) Date of Patent: Jan. 3, 2012

(54) CONTINUOUSLY VARIABLE GRADED ARTIFICIAL DIELECTRICS USING NANOSTRUCTURES

(75) Inventor: Jeffrey Miller, Los Altos Hills, CA (US)

(73) Assignee: Nanosys, Inc., Palo Alto, CA (US)

( * ) Notice: Subject to any disclaimer, the term of this patent is extended or adjusted under 35 U.S.C. 154(b) by 330 days.

(21) Appl. No.: 11/589,988

(22) Filed: Oct. 31, 2006

(65) Prior Publication Data

US 2011/0165405 A1  Jul. 7, 2011

(51) Int. Cl.
*H01L 23/46* (2006.01)
(52) U.S. Cl. .................................. 257/746; 257/E51.04
(58) Field of Classification Search ............... 136/236.1; 257/414, 678, E51.04, 347; 313/509; 428/402, 428/209; 438/9, 780, 399, 483; 365/185.03
See application file for complete search history.

(56) References Cited

U.S. PATENT DOCUMENTS

| | | | |
|---|---|---|---|
| 5,063,418 A | 11/1991 | Shurtz, II et al. |
| 5,063,518 A | 11/1991 | Shurtz, II et al. |
| 5,096,551 A | 3/1992 | Schoen, Jr. et al. |
| 5,196,396 A | 3/1993 | Lieber |
| 5,252,835 A | 10/1993 | Lieber et al. |
| 5,325,103 A | 6/1994 | Schuss |
| 5,332,910 A | 7/1994 | Haraguchi et al. |
| 5,385,623 A | 1/1995 | Diaz |
| 5,400,043 A | 3/1995 | Arceneaux et al. |
| 5,505,928 A | 4/1996 | Alivisatos et al. |
| 5,583,318 A | 12/1996 | Powell |
| 5,662,982 A | 9/1997 | Diaz |
| 5,690,807 A | 11/1997 | Clark, Jr. et al. |
| 5,751,018 A | 5/1998 | Alivisatos et al. |
| 5,840,435 A | 11/1998 | Lieber et al. |
| 5,897,945 A | 4/1999 | Lieber et al. |
| 5,990,479 A | 11/1999 | Weiss et al. |
| 5,997,832 A | 12/1999 | Lieber et al. |
| 6,031,711 A | 2/2000 | Tennent et al. |
| 6,036,774 A | 3/2000 | Lieber et al. |
| 6,048,616 A | 4/2000 | Gallagher et al. |
| 6,075,485 A | 6/2000 | Lilly et al. |
| 6,097,271 A | 8/2000 | Kozakoff |
| 6,136,156 A | 10/2000 | El-Shall et al. |
| 6,159,742 A | 12/2000 | Lieber et al. |
| 6,190,634 B1 | 2/2001 | Lieber et al. |
| 6,207,229 B1 | 3/2001 | Bawendi et al. |

(Continued)

OTHER PUBLICATIONS

Bjork, M.T. et al. "One-dimensional steeplechase for electrons realized" Nano Letters (2002) 2:86-90.

(Continued)

*Primary Examiner* — Matthew E Warren
*Assistant Examiner* — Fang-Xing Jiang
(74) *Attorney, Agent, or Firm* — Donna M. Fabian

(57) ABSTRACT

Graded artificial dielectrics using nanostructures, such as nanowires, are disclosed. The graded artificial dielectric includes a material (typically a dielectric) with a plurality of nanostructures, such as nanowires, embedded within the dielectric material. One or more characteristics of the nanostructures are spatially varied from a first region within the dielectric to a second region within the dielectric to produce permittivity of the graded artificial dielectric that is spatially varied. The characteristics that can be varied include, but are not limited to, nanostructure density, nanostructure length, nanostructure aspect ratio, nanostructure oxide ratio, and nanostructure alignment. Methods of producing graded artificial dielectrics are also provided. A wide range of electronic devices such as antennas can use graded artificial dielectrics with nanostructures to improve performance.

37 Claims, 22 Drawing Sheets

U.S. PATENT DOCUMENTS

| | | | |
|---|---|---|---|
| 6,225,198 | B1 | 5/2001 | Alivisatos et al. |
| 6,306,736 | B1 | 10/2001 | Alivisatos et al. |
| 6,317,092 | B1 | 11/2001 | de Schweinitz et al. |
| 6,322,901 | B1 | 11/2001 | Bawendi et al. |
| 6,413,489 | B1 | 7/2002 | Ying et al. |
| 6,567,048 | B2 | 5/2003 | McKinzie, III et al. |
| 6,576,291 | B2 | 6/2003 | Bawendi et al. |
| 6,589,629 | B1 | 7/2003 | Bao et al. |
| 6,616,794 | B2 | 9/2003 | Law et al. |
| 6,646,605 | B2 | 11/2003 | McKinzie, III et al. |
| 6,700,771 | B2 | 3/2004 | Bhattacharyya |
| 6,713,176 | B2 * | 3/2004 | Yadav et al. ............... 428/402 |
| 6,872,645 | B2 | 3/2005 | Sahi et al. |
| 6,878,871 | B2 | 4/2005 | Scher et al. |
| 6,987,591 | B2 | 1/2006 | Shaker et al. |
| 7,019,391 | B2 * | 3/2006 | Tran ............... 257/678 |
| 7,129,554 | B2 * | 10/2006 | Lieber et al. ............... 257/414 |
| 7,189,435 | B2 | 3/2007 | Tuominen et al. |
| 7,242,142 | B2 * | 7/2007 | Kim et al. ............... 313/509 |
| 7,407,872 | B2 * | 8/2008 | Han et al. ............... 438/483 |
| 7,446,014 | B2 * | 11/2008 | Zhang et al. ............... 438/399 |
| 7,452,828 | B2 * | 11/2008 | Hirakata et al. ............... 438/780 |
| 7,465,871 | B2 * | 12/2008 | Chen et al. ............... 136/236.1 |
| 2002/0018861 | A1 | 2/2002 | Hill et al. |
| 2002/0192441 | A1 * | 12/2002 | Kalkan et al. ............... 428/209 |
| 2003/0008123 | A1 | 1/2003 | Glatkowski et al. |
| 2004/0005723 | A1 | 1/2004 | Chow et al. |
| 2004/0026684 | A1 | 2/2004 | Empedocles |
| 2004/0095658 | A1 | 5/2004 | Buretea et al. |
| 2004/0112964 | A1 | 6/2004 | Duan et al. |
| 2004/0124410 | A1 | 7/2004 | Lee et al. |
| 2004/0127637 | A1 | 7/2004 | Hsu et al. |
| 2004/0135951 | A1 | 7/2004 | Stumbo et al. |
| 2004/0136866 | A1 | 7/2004 | Pontis et al. |
| 2004/0146560 | A1 | 7/2004 | Whiteford et al. |
| 2004/0178390 | A1 | 9/2004 | Whiteford et al. |
| 2004/0206448 | A1 | 10/2004 | Dubrow |
| 2004/0250950 | A1 | 12/2004 | Dubrow |
| 2005/0038498 | A1 | 2/2005 | Dubrow et al. |
| 2005/0064185 | A1 | 3/2005 | Buretea et al. |
| 2005/0066883 | A1 | 3/2005 | Dubrow et al. |
| 2005/0079659 | A1 | 4/2005 | Bock et al. |
| 2005/0109989 | A1 | 5/2005 | Whiteford et al. |
| 2005/0110064 | A1 | 5/2005 | Duan et al. |
| 2005/0126628 | A1 | 6/2005 | Scher et al. |
| 2005/0153464 | A1 * | 7/2005 | Fainman et al. ............... 438/9 |
| 2005/0181195 | A1 | 8/2005 | Dubrow |
| 2005/0201149 | A1 * | 9/2005 | Duan et al. ............... 365/185.03 |
| 2005/0219788 | A1 | 10/2005 | Chow et al. |
| 2006/0040103 | A1 | 2/2006 | Whiteford et al. |
| 2006/0207647 | A1 | 9/2006 | Tsakalakos et al. |
| 2006/0279905 | A1 | 12/2006 | Chow et al. |

OTHER PUBLICATIONS

Browning, S.L. et al., "Fabrication and Radio Frequency Characterization of High Dielectric Loss Tubule-Based Composites near Percolation", J. Appl. Phys. (1998) 84(11):6109-6113.

Cao, Y et al. "Growth and properties of semiconductor core/shell nanocrystals with InAs cores" J. Am. Chem. Soc. (2000) 122:9692-9702.

Cui, Y. et al. "Doping and electrical transport in silicon nanowires" J. Phys. Chem. B (2000) 104:5213-5216.

Cui, Y. et al. "Diameter-controlled synthesis of single-crystal silicon nanowires" Appl. Phys. Lett. (2001) 78:2214-2216.

Dabbousi, B.O. et al. "(CdSe)ZnS core-shell quantum dots: Synthesis and characterization of a size series of highly luminescent nanocrysallites" J. Phys. Chem. B (1997) 101:9463-9475.

Duan, X. et al. "General synthesis of compound semiconductor nanowires" Adv. Mater. (2000) 12:298-302.

Greene, L.E. et al., "Low-temperature wafer-scale production of ZnO nanowire arrays" Angew. Chem. Int. Ed. (2003) 42-3031-3034.

Gudiksen, M.S. et al "Diameter-selective synthesis of semiconductor nanowires" J. Am. Chem. Soc. (2000) 122:8801-8802.

Gudiksen, M.S. et al. "Synthetic control of the diameter and length of single crystal semiconductor nanowires" J. Phys. Chem. B (2001) 105:4062-4064.

Gudiksen, M.S. et al. "Growth of nanowire superlattice structures for nanoscale photonics and electronics" Nature (2002) 415:617-620.

Haraguchi, K. et al., "Polarization Dependence of Ligh Emitted from GaAs p-n junctions in quantum wire crystals" J. Appl. Phys. (1994) 75(8):4220-4225.

Haraguchi, K. et al., "Self-organized fabrication of planar GaAs nanowhisker arrays" Appl. Phys. Lett (1996) 69(3):386-387.

Hiruma, K. et al., "GaAs free-standing quantum-size wires" J. Appl. Phys. (1993) 74(5):3162-3171.

Jun, Y-W, et al., "Controlled synthesis of multi-armed CdS nanorod architectures using monosurfactant system" J. Am. Chem. Soc. (2001) 123:5150-5151.

Kong, J. et al., "Synthesis of individual single-walled carbon nanotubes on patterned silicon wafers" Nature (1998) 395:878-881.

Kong, J. et al., "Chemical vapor deposition of methane for single-walled carbon nanotubes" Chem. Phys. Lett (1998) 292:567-574.

Liu, C. et al. "Sol-Gel Synthesis of Free-Standing Ferroelectric Lead Zirconate Titanate Nanoparticles" J. Am. Chem. Soc. (2001) 123:4344-4345.

Manna, L. et al. "Synthesis of Soluble and Processable Rod-, Arrow-, Teardrop-, and Tetrapod-Shaped CdSe Nanocrystals" J. Am. Chem. Soc. (2000) 122:12700-12706.

Manna, L. et al. "Epitaxial growth and photochemical annealing of graded CdS/ZnS shells on colloidal CdSe nanorods" J. Am. Chem. Soc. (2002) 124:7136-7145.

Morales, A.M. et al. "A laser ablation method for the synthesis of crystalline semiconductor nanowires" Science (1998) 279:208-211.

Palibroda, E. et al., "Aluminium porous oxide growth. On the electric conductivity of the barrier layer," Thin Solid Films (1995) 256:101-105.

Peng, X. et al. "Epitaxial growth of highly luminescent CdSe/CdS core/shell nanocrystals with photostability and electronic accessibility" J. Am. Chem. Soc. (1997) 119:7019-7029.

Peng, X. et al. "Shape Control of CdSe Nanocrystals" Nature (2000) 404:59-61.

Puntes, V.F. et al. "Colloidal nanocrystal shape and size control: The case of cobalt" Science (2001) 291:2115-2117.

Schon, J.H. et al., "Self-assembled monolayer organic field-effect transistors" Nature (2001) 413:713-716.

Stockton, W., et al., "Artificial Dielectric Properties of Microscopic Metalized Filaments in Composites" J.Appl. Phys. (1991) 70(9):4679-4686.

Thess, A. et al., "Crystalline ropes of metallic carbon nanotubes" Science (1996) 273:483-487.

Urban, J.J. et al. "Synthesis of single-crystalline perovskite nanowires composed of barium titanate and strontium titanate" J. Am. Chem. Soc. (2002) 124:1186-1187.

Wu, Y et al. "Block-by-block growth of single-crystalline Si/SiGe superlattice nanowires" Nano Letters (2002) 2:83-86.

Yazawa, M. et al., "Semiconductor nanowhiskers" Adv. Mater. (1993) 5:577-580.

Yun, W.S. et al. "Ferroelectric Properties of Individual Barium Titanate Nanowires Investigated by Scanned Probe Microscopy" Nanoletters (2002) 2:447-450.

Zhou, C. et al., "Nanoscale metal/self-assembled monolayer/metal heterostructures" Appl. Phys. Lett. (1997) 71:611-613.

* cited by examiner

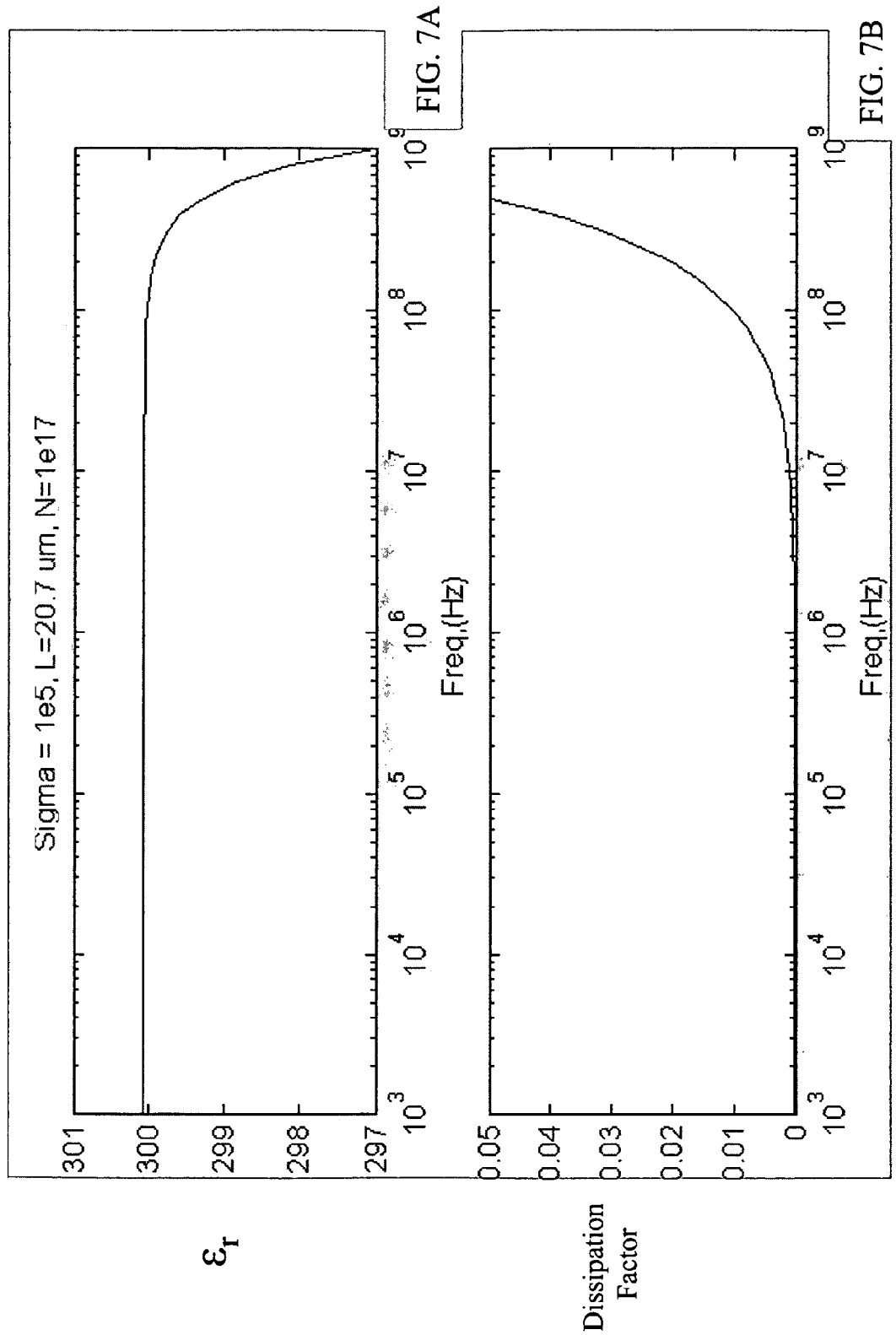

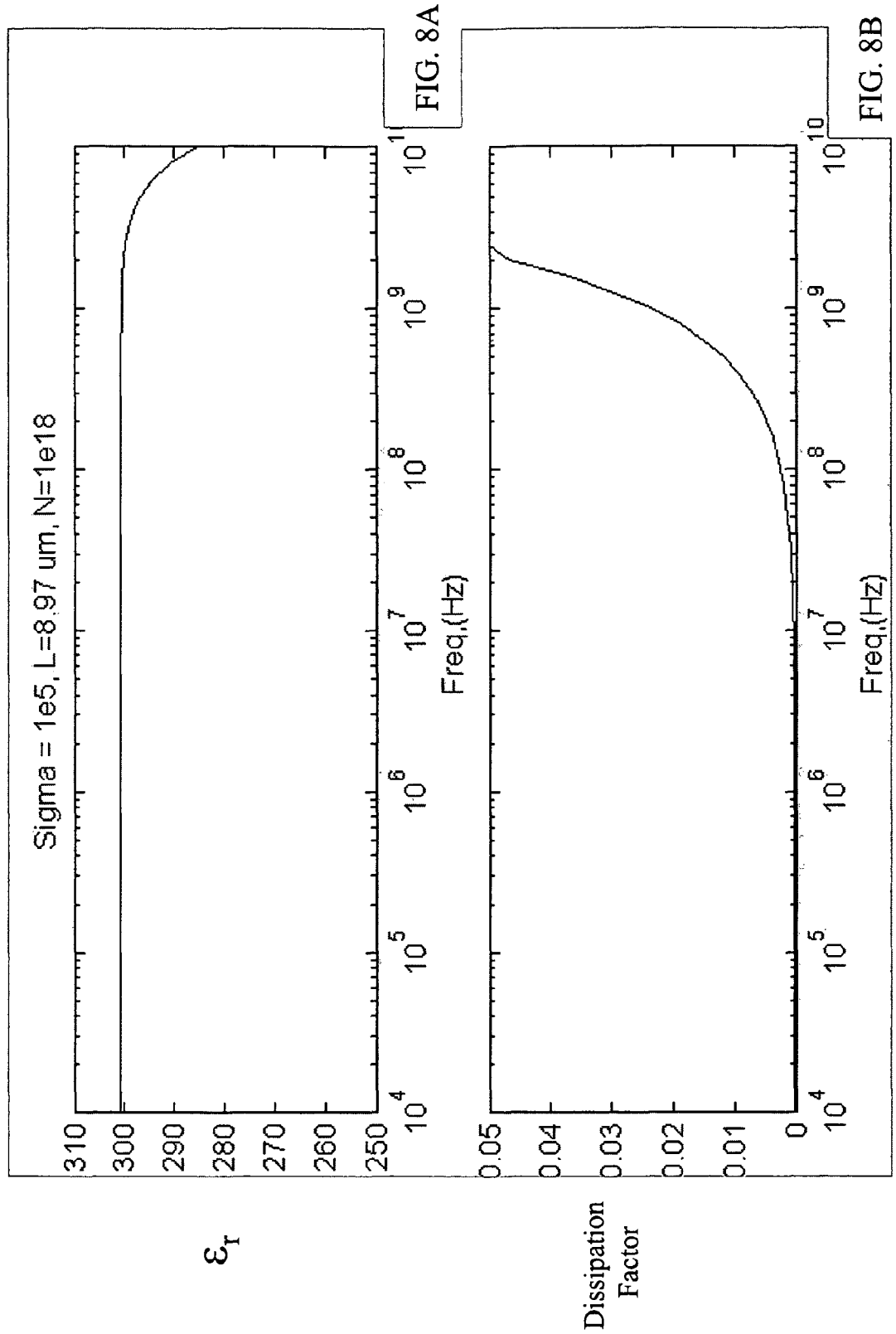

CONTINUOUSLY VARIABLE GRADED ARTIFICIAL DIELECTRICS USING NANOSTRUCTURES

BACKGROUND OF THE INVENTION

1. Field of the Invention

The invention relates to nanowires, and more particularly to controllable artificial dielectrics using nanowires.

2. Background Art

Dielectrics are materials that are used primarily to isolate components electrically from each other or to act as capacitive elements in devices, circuits and systems. A unique characteristic of a dielectric is that nearly all or a portion of the energy required for its charging from an external electrical field can be recovered when the field is removed. Dielectrics have an extremely wide range of applications, including but not limited to, electrical components used in communications to radar absorbing materials (RAM).

Example dielectric materials include polyethylene, polypropylene, polystyrene, cross-linked polystyrene, fused silica, fused quartz, Alumina ($Al_2O_3$), Boron Nitride (BN), Beryllium Oxide (BeO) and Magnesium Oxide (MgO). Polyethylene is one of the most common solid dielectrics, which is extensively used as a solid dielectric extruded insulant in power and communication cables. Polypropylene also has many electrical applications both in bulk form and in molded and extruded insulations as well as in film form in taped capacitor, transformer and cable insulations. Alumina is used for dielectric substrates in microcircuit applications. Magnesium oxide is a common inorganic insulating material which is utilized for insulating heating elements in ovens. A wide range of dielectric materials exist with a wide range of applications. Further discussion of dielectric materials and their uses can be found in R. Bartnikas, *Dielectrics and Insulators*, in The Electrical Engineering Handbook 1143-1150 (Michael C. Dorf, ed. CRC Press 1993), which is herein incorporated in its entirety by reference.

Two fundamental parameters characterize a dielectric material. These are conductivity, $\sigma$, and the value of the real permittivity Or dielectric constant, $\epsilon_r$. The conductivity is equal to the ratio of the dielectric's leakage current density $J_1$ to an applied electric field E. Equation (1) provides this relationship:

$$\sigma = J_1/E \tag{1}$$

The dielectric constant, $\epsilon_r$, is determined from the ratio:

$$\epsilon_r = C/C_o \tag{2}$$

where, C represents the measured capacitance in fahrad (F) and $C_o$ is the equivalent capacitance in vacuum, which is calculated for the same specimen geometry from $C_o = \epsilon_o A/d$. $\epsilon_o$ denotes the permittivity of the dielectric in vacuum and is equal to $8.854 \times 10^{-14}$ Fcm$^{-1}$. A is the surface area of the dielectric and d is the thickness of the dielectric. Liquid and solid dielectric materials typically have dielectric constants ranging from approximately 2 to 10. Example approximate dielectric constants for common dielectrics at 20° C. with a 1 Mhz signal are as follows.

| Dielectric | Dielectric Constant |
| --- | --- |
| Alumina | 8.5 |
| Magnesium Oxide | 9.69 |
| Polypropylene | 2.3 |
| Polyethylene | 2.25 |

An important dielectric characteristic is the dielectric loss or dissipation factor. Under alternating current (AC) conditions dielectric loss arises mainly from the movement of free charge carriers (electrons and ions), space charge polarization, and dipole orientation. Ionic, space charge, and dipole losses are temperature and frequency dependent, a dependency which is reflected in the measured valued of $\sigma$ and $\epsilon_r$. This necessitates the introduction of a complex permittivity defined by $$\epsilon = \epsilon_r - j\epsilon_i \tag{3}$$

where $\epsilon_i$ is the imaginary value of the permittivity.

The complex permittivity, $\epsilon$, is equal to the ratio of the dielectric displacement vector D to the electric field vector E, as given by $$\epsilon = D/E \tag{4}$$

Under AC conditions the appearance of a loss or leakage current is manifest as a phase angle difference between the D and E vectors. D and E may be expressed as:

$$D = D_o \exp[j(\omega t - \delta)] \tag{5}$$

$$E = E_o \exp[j\omega t] \tag{6}$$

Where $\omega$ is the radial frequency term, t the time, $\delta$ is a phase difference between D and E, and $D_0$ and $E_0$ the respective magnitudes of the two vectors. From these relationships it follows that $$\epsilon_r = D_o/E_o * \cos \delta \tag{7}$$

$$\epsilon_i = D_0/E_0 * \sin \delta \tag{8}$$

Under AC conditions the magnitude of loss of a given material is defined as its dissipation factor, tan $\delta$. From equations (7) and (8), the dissipation factor can be represented as $$\tan \delta = \epsilon_i/\epsilon_r = \sigma/\omega\epsilon_r \tag{9}$$

These basic characteristics and example dielectric materials illustrate the wide range of dielectrics, applications and characteristics. Nonetheless, the desire to employ dielectrics with more robust operating characteristics for evermore increasing applications combined with the physical limitations of dielectric materials, led to the development of a wide variety of dielectric structures and the creation of artificial dielectrics.

An example of a dielectric structure developed for shielding electromagnetic energy is provided in U.S. Pat. No. 5,583,318, entitled Multi-Layer Shield for Absorption of Electromagnetic Energy, issued to Powell on Dec. 10, 1996 ('318 Patent). The '318 Patent teaches a multi-layer structure for shielding electromagnetic energy in a data processing equipment enclosure. The multi-layer structure is designed to substantially reduce spurious transmissions from a source within the data processing equipment enclosure by absorbing the electromagnetic energy and dissipating the electromagnetic energy as heat within the multi-layer structure. The multi-layer structure is formed by stacking various layers of dielectric, conductive and/or polymer materials together. The effective impedance of the multi-layer structure is changed by selecting different combinations of materials to change the effective properties of the shielding structure.

Another example of a dielectric structure and process for producing such a structure is given in U.S. Pat. No. 6,589,629, entitled Process for Fabricating Patterned, Functionalized Particles and Article Formed from Particles, issued to Bao et al., on Jul. 8, 2003 ('629 Patent). The '629 Patent teaches a technique for forming functionalized particles, where such particles are readily formed into periodic structures. The functionalized particles are capable of being formed into an ordered structure, by selection of appropriate complementary functionalizing agents on a substrate and/or on other particles. This process can be used to develop photonic band gap (PBG) materials. PBG materials are potentially useful as waveguides and microcavities for lasers, filters, polarizers, and planar antenna substrates. A PBG material is generally formed by combining a high refractive index dielectric material with a three dimensional lattice of another material having a low refractive index, to form a three-dimensional Bragg grating. The propagation of light in the PBG structure therefore depends on the particular energy of the photon.

Investigations have been made into the formation of artificial dielectric composites by the inclusion of high-aspect ratio conductive filaments into polymer matrices. W. Stockton, et al., *Artificial Dielectric Properties of Microscopic Metalized Filaments in Composites,* 70 (9) J. Appl. Phys. 4679 (1991). Stockton examined two size ranges of filaments, commercially available fibers with diameters near 10 μm, and self assembling microstructures, derived from organic surfactants, whose diameters were about twentyfold smaller. Stockton at 4679. Stockton noted that both high and low dielectric loss composites are possible depending on filament conductivity. Id. Stockton further noted that in a complex material such as the fiber/polymer there is a large number of experimental values—particle diameters, length distributions, aspect ratios, metallization thickness, conductivity, particle dispersion, clustering, alignment, polymer matrix dielectric properties, and density—that affect composite permittivities. Id. Stockton used metal films (e.g., nickel, copper, iron or permalloy) to create metalized tubules or fibers for use as the filaments to be embedded within the dielectric material. Id. at 4681.

Similarly, the effect of adding metalized tubules to an insulating polymer were examined by Browning et al. S. L. Browning et al., *Fabrication and Radio Frequency Characterization of High Dielectric Loss Tubule-Based Composites near Percolation,* 84 (11) J. Appl. Phys. 6109 (1998). Browning observed that when sufficient particles have been loaded the composite of tubules and polymers will begin to conduct over macroscopic distances. The onset of this transition is called percolation, and the volume loading of conducting particles at this point is termed the percolation threshold. Browning noted that percolation is accompanied by substantial changes in dielectric properties. Browning at 6109. Browning examined permittivities as a function of loading volume of the tubules. Id. at 6111.

Existing artificial dielectrics are limited in their application and use because they typically have relatively low dielectric constants and have fixed dielectric constants at a particular frequency. These limitations, as discussed in Stockton, have been attributed to clumping of metallized fibers once the density of the fibers becomes high. When the metallized fibers clump, they lose their insulative characteristics and become conducting, thereby limiting the ability to achieve high dielectric constants within existing artificial dielectrics. Furthermore, dielectric structures based on existing dielectrics and dielectric structures are limited in their application.

The '432 Application addressed the need for artificial dielectrics to have very high dielectric constants that can be statically or dynamically adjusted based on a wide range of potential applications. An additional need exists to provide continuously variable permittivities within an artificial dielectric.

What are needed are artificial dielectrics that have spatially varying permittivities.

BRIEF SUMMARY OF THE INVENTION

Graded artificial dielectrics using nanostructures, such as nanowires, are disclosed. The graded artificial dielectric includes a material (typically a dielectric) with a plurality of nanostructures, such as nanowires, embedded within the dielectric material. One or more characteristics of the nanostructures are spatially varied to produce permittivity of the graded artificial dielectric that is spatially varied. The characteristics that can be varied include, but are not limited to, nanostructure density, nanostructure length, nanostructure aspect ratio, nanostructure oxide ratio, and nanostructure alignment. Methods of producing graded artificial dielectrics are also provided.

A wide range of electronic devices can use graded artificial dielectrics with nanostructures to improve performance. Example devices include, but are not limited to, capacitors, thin film transistors, other types of thin film electronic devices, microstrip devices, surface acoustic wave (SAW) filters, other types of filters, and radar attenuating materials (RAM).

Graded artificial dielectrics using nanostructures within electronic devices can be used to improve the performance of cell phones, wireless personal digital assistants, 802.11 PC cards, global positioning satellites (GPS) receivers, antennas such as patch antennas, antenna transmission lines, mobile telephone network interface adaptors or mobile telephone network base stations including interface cards, modules or other adaptors that permit laptops, computers or computer controlled systems to communicate data to and from a mobile telephone network, e.g. PDC, PDCP, GSM, GPRS, wide band CDMA, HSDPA, HSUPA and super-3G networks, and essentially any other apparatus that either receives or transmits radio waves.

Further embodiments, features, and advantages of the invention, as well as the structure and operation of the various embodiments of the invention are described in detail below with reference to accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 7A provides a chart of $\in_r$ for an artificial dielectric with nanowires when σ equals $1e^5$, the nanowire length is 20.7 μm and the density is $1e^{17}$ nanowires/cm$^3$.

FIG. 7B provides a chart of the dissipation factor for an artificial dielectric with nanowires when σ equals $1e^5$, the nanowire length is 20.7 μm and the density is $1e^{17}$ nanowires/cm$^3$.

FIG. 8A provides a chart of $\in_r$ for an artificial dielectric with nanowires when a equals $1e^5$, the nanowire length is 8.97 μm and the density is $1e^{18}$ nanowires/cm$^3$.

FIG. 8B provides a chart of the dissipation factor for an artificial dielectric with nanowires when a equals $1e^5$, the nanowire length is 8.97 μm and the density is $1e^{18}$ nanowires/cm$^3$.

Figure 1A:
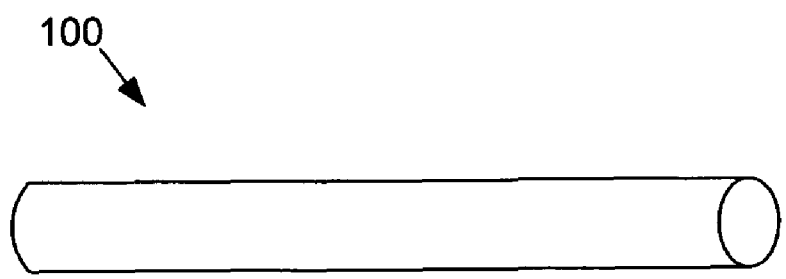
FIG. 1A is a diagram of a single crystal semiconductor nanowire.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires, and to a semiconductor diode device.

Moreover, while a single nanowire is illustrated for the specific implementations discussed, the implementations are not intended to be limiting and a wide range of the number of nanowires and spacing can also be used. It should be appreciated that although nanowires are frequently referred to, the techniques described herein are also applicable to other nanostructures, such as nanorods, nanotubes, nanotetrapods, nanoribbons and/or combination thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g. heterostructures). Nanostructures can be, e.g., substantially crystalline, substantially monocrystalline, polycrystalline, amorphous, or a combination thereof. In one aspect, each of the three dimensions of the nanostructure has a dimension of less than about 500 nm, e.g., less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably greater than 50, and more preferably, greater than 100.

The nanowires of this invention can be substantially homogeneous in material properties, or in certain embodiments can be heterogeneous (e.g. nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, CaCN2, ZnGeP2, CdSnAs2, ZnSnSb2, CuGeP3, CuSi2P3, (Cu, Ag)(Al, Ga, In, Tl, Fe)(S, Se, Te)2, Si3N4, Ge3N4, Al2O3, (Al, Ga, In)2 (S, Se, Te)3, Al2CO, and an appropriate combination of two or more such semiconductors.

The nanowires can also be formed from other materials such as metals such as gold, nickel, palladium, iradium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom", etc.) made herein are for purposes of illustration only, and that devices of the present invention can be spatially arranged in any orientation or manner.

There are many advantages of nanowires compared to standard semiconductors, including the use of insulating, flexible, or low-loss substrates, cost, and the ability to integrate nanowires into large structures. The present invention is directed to methods which apply these advantages to artificial dielectrics using nanowires. While the examples and discussion provided focus on nanowires, nanotubes, nanorods, and nanoribbons can also be used.

Artificial Dielectric Using Nanowires Embodiments

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
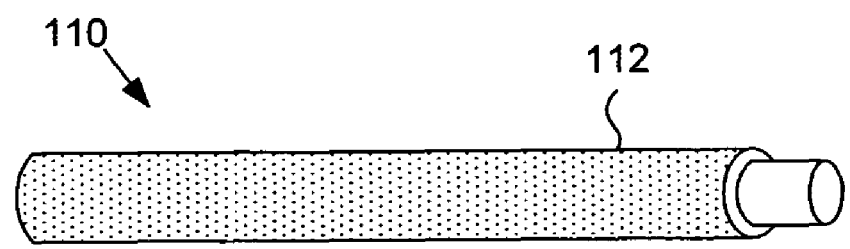
FIG. 1B is a diagram of a nanowire doped according to a core-shell structure.

FIG. 1B shows a nanowire 110 doped according to a core-shell structure. As shown in FIG. 1B, nanowire 110 has a doped surface layer 112, which can have varying thickness levels, including being only a molecular monolayer on the surface of nanowire 110.

The valence band of the insulating shell can be lower than the valence band of the core for p-type doped wires, or the conduction band of the shell can be higher than the core for n-type doped wires. Generally, the core nanostructure can be made from any metallic or semiconductor material, and the shell can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the shell can comprise a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801-8802; Cui et al. (2001) "Diameter-controlled synthesis of single-crystal silicon nanowires" *Appl. Phys. Lett.* 78, 2214-2216; Gudiksen et al. (2001) "Synthetic control of the diameter and length of single crystal semiconductor nanowires" *J. Phys. Chem. B* 105, 4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" *Nature* 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150-5151; and Manna et al. (2000) "*Synthesis of Soluble and Processable Rod-, Arrow-, Teardrop-, and Tetrapod-Shaped CdSe Nanocrystals*" *J. Am. Chem. Soc.* 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019-7029; Dabbousi et al. (1997) "(CdSe)ZnS core-shell quantum dots: Synthesis and characterization of a size series of highly luminescent nanocrysallites" *J. Phys. Chem. B* 101, 9463-9475; Manna et al. (2002) "*Epitaxial growth and photochemical annealing of graded CdS/ZnS shells on colloidal CdSe nanorods*" *J. Am. Chem. Soc.* 124, 7136-7145; and Cao et al. (2000) "Growth and properties of semiconductor core/shell nanocrystals with InAs cores" *J. Am. Chem. Soc.* 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application 60/370,095 (Apr. 2, 2002) to Empedocles entitled "Nanowire heterostructures for encoding information." Similar approaches can be applied to growth of other heterostructures.

In certain embodiments, the collection or population of nanostructures employed in the artificial dielectric is substantially monodisperse in size and/or shape. See, e.g., US patent application 20020071952 by Bawendi et al entitled "Preparation of nanocrystallites."

Figure 1C:
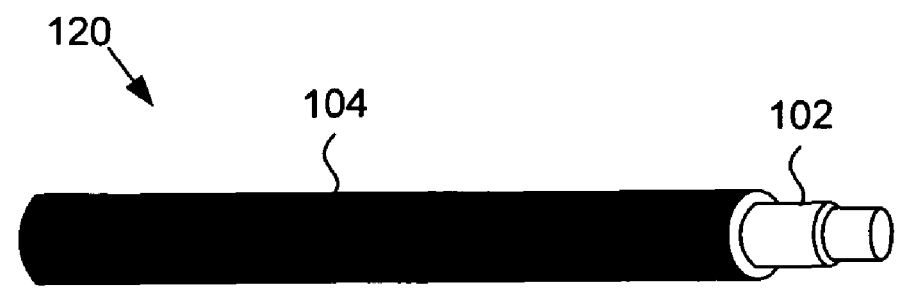
FIG. 1C is a diagram of a nanowire that has a doped surface layer and an insulating coating.

FIG. 1C shows a nanowire 120 that is doped with a doped surface layer 112 according to the core-shell structure shown in FIG. 1B, and is also coated with an insulator layer 114.

Figure 2A:
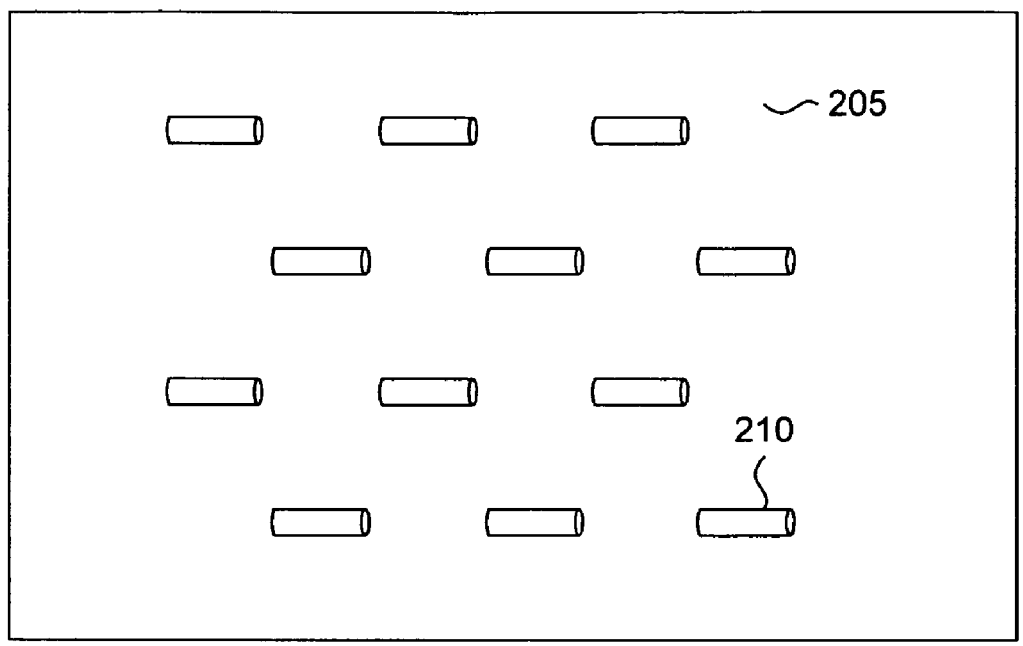
FIG. 2A is a diagram of an artificial dielectric using nanowires, according to an embodiment of the invention.
Figure 2B:
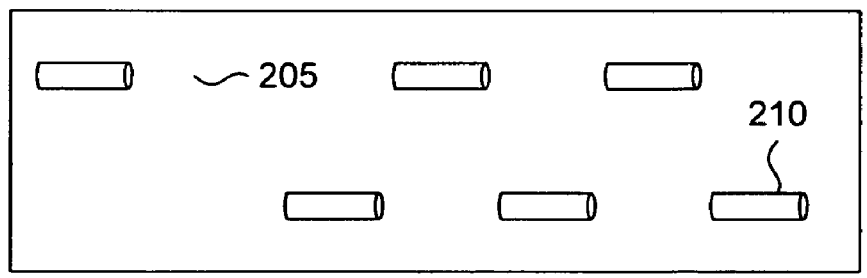
FIG. 2B is a diagram of a side perspective of an artificial dielectric, according to an embodiment of the invention.

An artificial dielectric can be created by embedding nanostructures, such as nanowires (and/or other nanostructures), in a material, such as a dielectric material. FIG. 2A illustrates artificial dielectric 200, according to an embodiment of the invention. Artificial dielectric 200 includes dielectric material 205 and nanostructures, such as nanowires, for example, nanowires 210. FIG. 2B illustrates a side perspective of artificial dielectric 200, according to an embodiment of the invention. The side perspective illustrates the embedded nature of the nanowires throughout the dielectric material. The nanowires can be embedded in a wide range of dielectric materials, including but not limited solid dielectrics, such as plastics, metal oxides, glasses, semiconductors (e.g., silicon), and pure single crystals (e.g., diamond, sapphire, quartz) as well as those described above and in R. Bartnikas, *Dielectrics and Insulators*, in The Electrical Engineering Handbook 1143-1150 (Michael C. Dorf, ed. CRC Press 1993). The dielectric materials can include both liquid and solid dielectric materials. The dielectric material may include one or more fillers such as fine particle sized powdered materials (e.g., mica, silica, glass, and wood flour) to improve physical properties, or may be made from a composite or mixture of materials formulated to a specific dielectric constant or loss tangent, for example.

In embodiments the nanowires can be metals, silicon, semiconductors or other materials and material combinations as described above for nanowires, nanorods, nanotubes, nanotetrapods, or nanoribbons. The nanowires can be embedded in a dielectric in the form of a matrix or in a thin film. The nanowires can be distributed within the artificial dielectric isotropically or anisotropically.

The dielectric constant of artificial dielectric 200 can be adjusted by varying the length, diameter, carrier density, shape, aspect ratio, orientation and density of the nanowires, such as nanowire 210. When silicon nanowires are used, a silicon oxide insulator can be created around the nanowire. This avoids the percolation problems of artificial dielectrics that use metalized fibers.

The resulting artificial dielectric can have an extremely large dielectric constant, and can be coated onto a surface, formed into a film or shaped into a wide variety of other configurations. Artificial dielectrics can also have dielectric constants that are dynamically controllable. By applying an electric field to a film of an artificial dielectric, it is possible to modulate the carrier density in the wires within the artificial dielectric by accumulation or inversion in the nanowires. Therefore, the electric field modulates the dielectric constant and reflectivity at an interface. In fact, by using oriented nanowires, the dielectric constant can be a function of polarization in that if the electric vector is aligned with the nanowires, the artificial dielectric comes into play. This, in turn, leads to a polarization-dependent change in reflectivity. That is, the artificial dielectric only changes reflectance if it is probed with the correct polarization.

The electric field can be DC, AC or pulse modulated to convey information. The pulse modulation could be a pseudo random sequence, so that the received beam has to be despread to come up out of the noise. The electric field can be applied with film or other electrodes on the top and bottom of the film, or by using the fringing fields from electrodes on one side, for example.

Artificial Dielectric Using Nanowire Component Applications

A wide range of potential applications exist for the use of an artificial dielectric with nanowires. Example devices include, but are not limited to, capacitors, thin film transistors, other types of thin film electronic devices, microstrip devices, surface acoustic wave (SAW) filters, other types of filters, and radar attenuating materials (RAM). Several exemplary embodiments are provided herein. These are not intended to limit the scope of the invention, but rather to show a wide range of examples to demonstrate the broad applicability of the invention to a wide range of devices.

Figure 3:
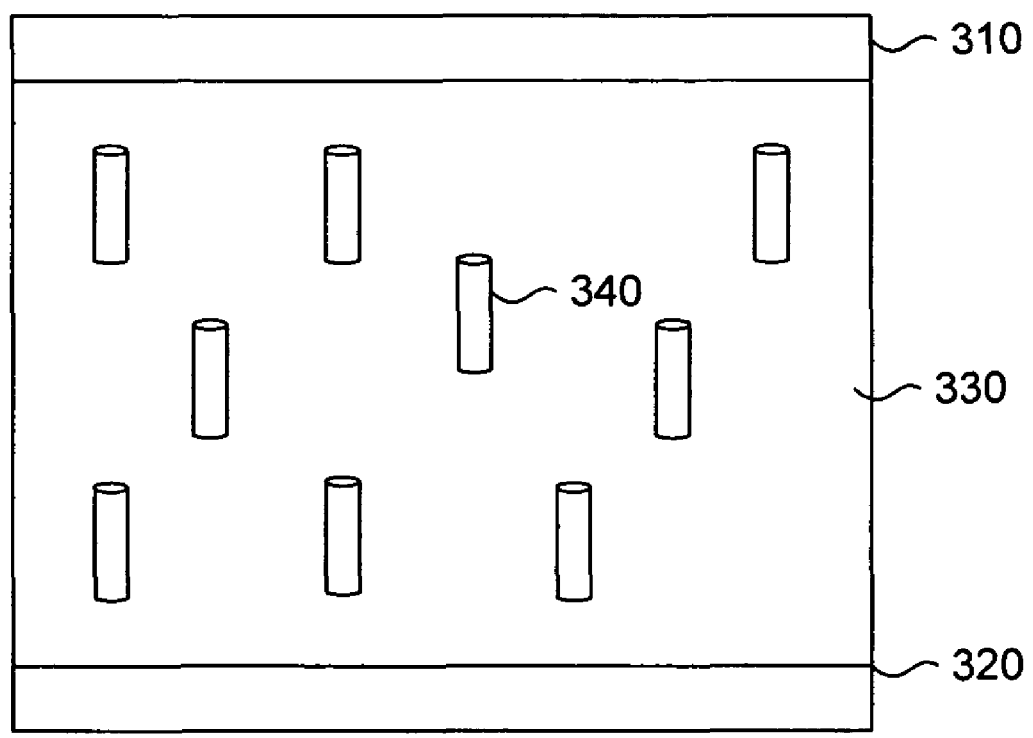
FIG. 3 is a diagram of a capacitor with an artificial dielectric using nanowires, according to an embodiment of the invention.

FIG. 3 illustrates capacitor 300 with an artificial dielectric using nanowires, according to an embodiment of the invention. Capacitor 300 includes two capacitor plates 310 and 320. Capacitor plate characteristics and materials are well known by individuals skilled in the relevant arts. Sandwiched between the two capacitor plates is an artificial dielectric including dielectric material 330 and nanowires, such as nanowire 340. When used voltage is applied across capacitor plates 310 and 320 in a conventional manner. Dielectric material 330 can be a typical dielectric material used in capacitors, as will be known by individuals skilled in the relevant arts, but is not limited to typical materials. In this application, to maximize the dielectric constant the nanowires should be perpendicular to the capacitor plates 310 and 310, which are roughly parallel to one another. Other nanowire orientations and capacitor plates can be used, albeit with reduced dielectric constants. By using an artificial dielectric within a capacitor, the dielectric constant can be raised by a factor of 100 over dielectrics used in existing capacitor. As a result, space needs for capacitors within electronics can significantly be reduced.

Figure 4:
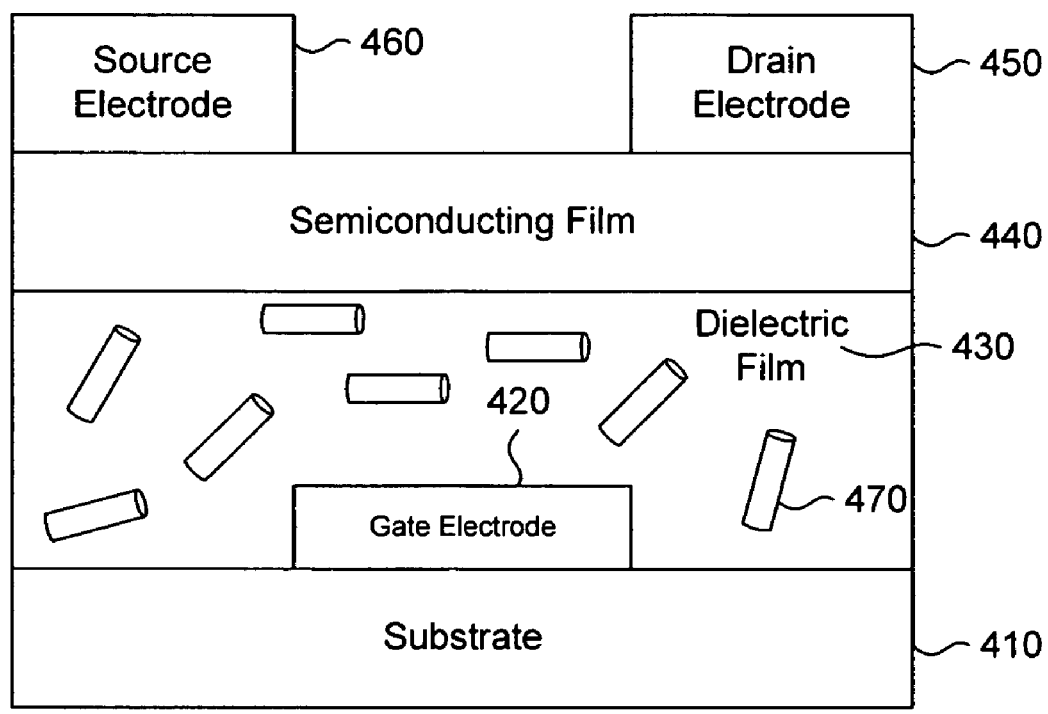
FIG. 4 is a diagram of a thin film transistor using an artificial dielectric with nanowires, according to an embodiment of the invention.

FIG. 4 is a diagram of thin film transistor 400 with an artificial dielectric using nanowires, according to an embodiment of the invention. Thin film transistor 400 includes substrate 410, gate electrode 420, dielectric film 430, semiconducting film 440, source electrode 460 and drain electrode 450. An artificial dielectric is created by embedding nanorods, such as nanorod 470 in dielectric film 430. Copending, commonly owned U.S. patent application Ser. No. 10/674,060, entitled Large Area Nanoenabled Macroelectronic Substrates and Uses Thereof, filed by Duan on Sep. 30, 2003, which is herein incorporated by reference in its entirety, provide thin films for use as semiconducting film 440, for example.

The use of a high dielectric constant artificial dielectric as the gate dielectric of a thin film transistor can significantly increase the transistor's performance. Thin film transistors on plastic or inorganic substrates, such as substrate 410, require a dielectric thin film for the gate dielectric. In FIG. 4 the gate dielectric is represented by the area containing dielectric film 430 and nanowires 470. As is well known by individuals skilled in the art, increased capacitive coupling from the gate electrode, such as gate electrode 420, to the semiconducting channel, represented in FIG. 4 by the area containing semiconducting film 440, improves the transistor performance.

One standard technique for increasing capacitive coupling is to reduce the thickness of the dielectric film between the semiconducting channel and the gate electrode.

However, for many types of processing envisioned for thin-film transistor fabrication (e.g., coating or printing processes), it is not possible to reduce the film thickness beyond a certain point. The present invention addresses this problem by introducing an artificial dielectric film, such as is created when nanorods 470 are embedded in dielectric film 430.

The artificial dielectric film uses an insulating polymer film for which the dielectric constant has been enhanced by embedding semiconducting or metallic nanorods in the polymer matrix. The effect of the embedded nanowires is to increase the effective dielectric constant of the film, thereby providing the same capacitive coupling as a thinner film of conventional dielectric material. Thus, the use of the artificial dielectric with nanowires allows high performance transistors to be built with thicker films compared to a conventional dielectric, allowing for high volume and low cost fabrication processes that would be desirable with plastic substrates.

Referring to FIG. 4, in an embodiment substrate 410 can be made of polyethylenenaphthalate (PEN). Gate electrode 420, drain electrode 450 and source electrode 460 can be made from a conducting polymer, such as polyaniline, or they may be metallic. Nanorods, such as nanorod 470, can be made from silicon or other semiconducting materials. Metallic nanorods would also be effective for increasing the dielectric constant. If silicon nanorods are used, they may be doped with arsenic, phosphorus, boron or other dopants to increase the conductivity. If different types of semiconducting materials are used, other dopants may be used.

For artificial dielectric 480 to be a good insulator it may be necessary to encapsulate nanorods, such as nanorod 470, in an insulating film, such as an oxide. The insulator will prevent the nanorods from acting as a conducting path through dielectric film 430. Dielectric film 430 can be made of polyimide. Semiconducting film 440 can be made of pentacene. The materials for each of the elements of thin film transistor are provided for illustrative purposes and are not intended to limit the scope of the invention. Based on the teachings herein, other materials for use in thin film transistor 400 will be known to individuals skilled in the relevant arts.

While thin-film transistor 400 is used to demonstrate the use of an artificial dielectric, many other device configurations can benefit from the higher dielectric constant of artificial dielectric 480. The thin-film transistor 400 structure is illustrative, and not intended to limit the scope of the invention.

Figure 5:
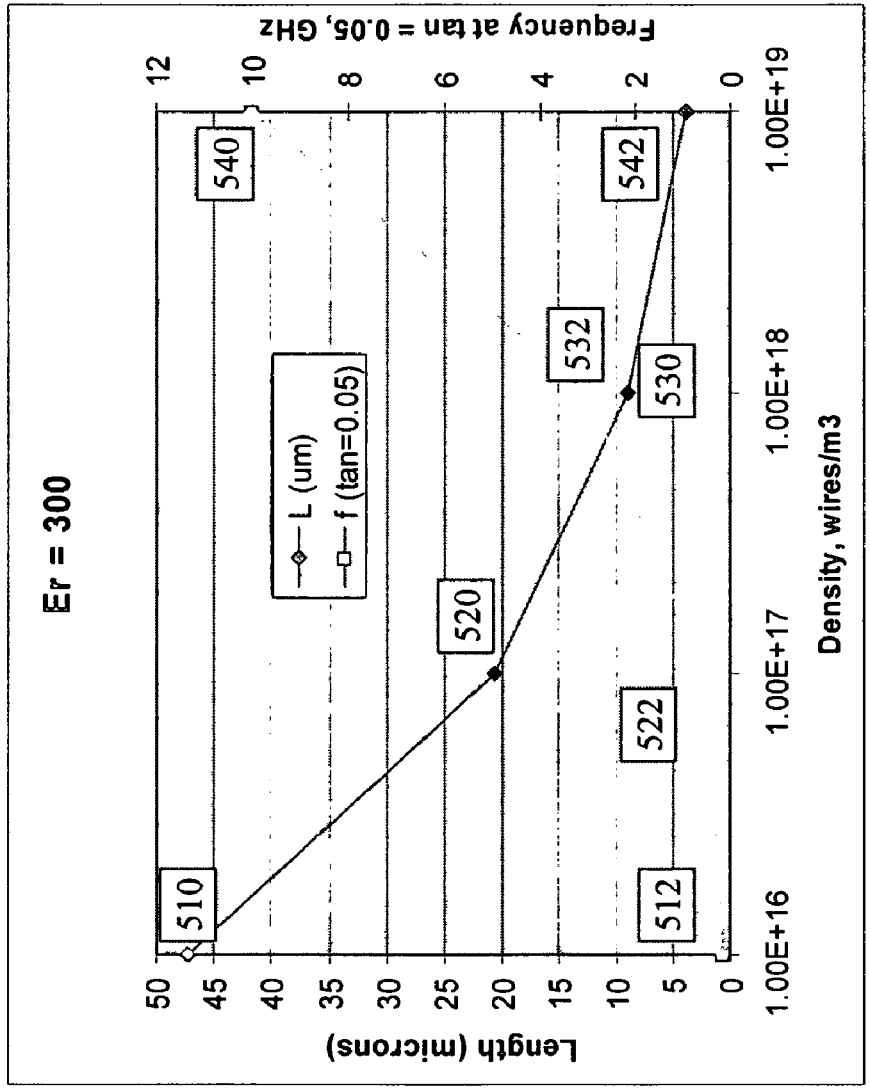
FIG. 5 is a plot that shows silicon nanowire lengths needed to achieve $\in_r=300$ with a reasonable dissipation factor, according to embodiments of the invention.

FIG. 5 provides a plot that shows silicon nanowire lengths needed to achieve $\in_r=300$ with a reasonable dissipation factor, according to embodiments of the invention. This range of the parameters in FIG. 5 are applicable to the use of artificial dielectrics with nanowires in electronic components, such as microstrip devices, SAW filters, capacitors, thin-film devices, etc. The chart plots the length of wire and the maximum frequency that an artificial dielectric using nanowires of that particular length could be used at while keeping the dissipation factor below 0.05. The conductivity of the nanowires is $1e^5$. So, for example, referring to FIG. 5, as shown by point 510 and 512 for a nanowire density of $1e^{16}$ nanowires/cm$^3$, the length of the nanowires would need to be about 47.3 μm to achieve $\in_r=300$ with a dissipation factor of 0.05. The maximum frequency that these parameters could be used would be less than 1 Ghz before the dissipation factor becomes greater than 0.05.

Similarly, as shown by points 520 and 522 for a nanowire density of $1e^{17}$ nanowires/cm$^3$, the length of the nanowires would need to be about 20.7 μm to achieve $\in_r=300$ with a dissipation factor of 0.05. The maximum frequency that these parameters could be used would also be less than 1 Ghz. As shown by points 530 and 532 for a nanowire density of $1e^{18}$ nanowires/cm$^3$, the length of the nanowires would need to be about 8.97 μm to achieve $\in_r=300$ with a dissipation factor of 0.05. The maximum frequency that these parameters could be used would be about 3 Ghz. As shown by points 540 and 542 for a nanowire density of $1e^{19}$ nanowires/cm$^3$, the length of the nanowires would need to be about 3.795 μm to achieve $\in_r=300$ with a dissipation factor of 0.05. The maximum frequency that these parameters could be used would be about 10 Ghz.

FIGS. 6-9 provide charts of $\in_r$ and the dissipation factor (which can also be referred to as the loss tangent) for each of the above combinations of nanowire densities and lengths, according to embodiments of the invention.

Figures 6A, 6B:
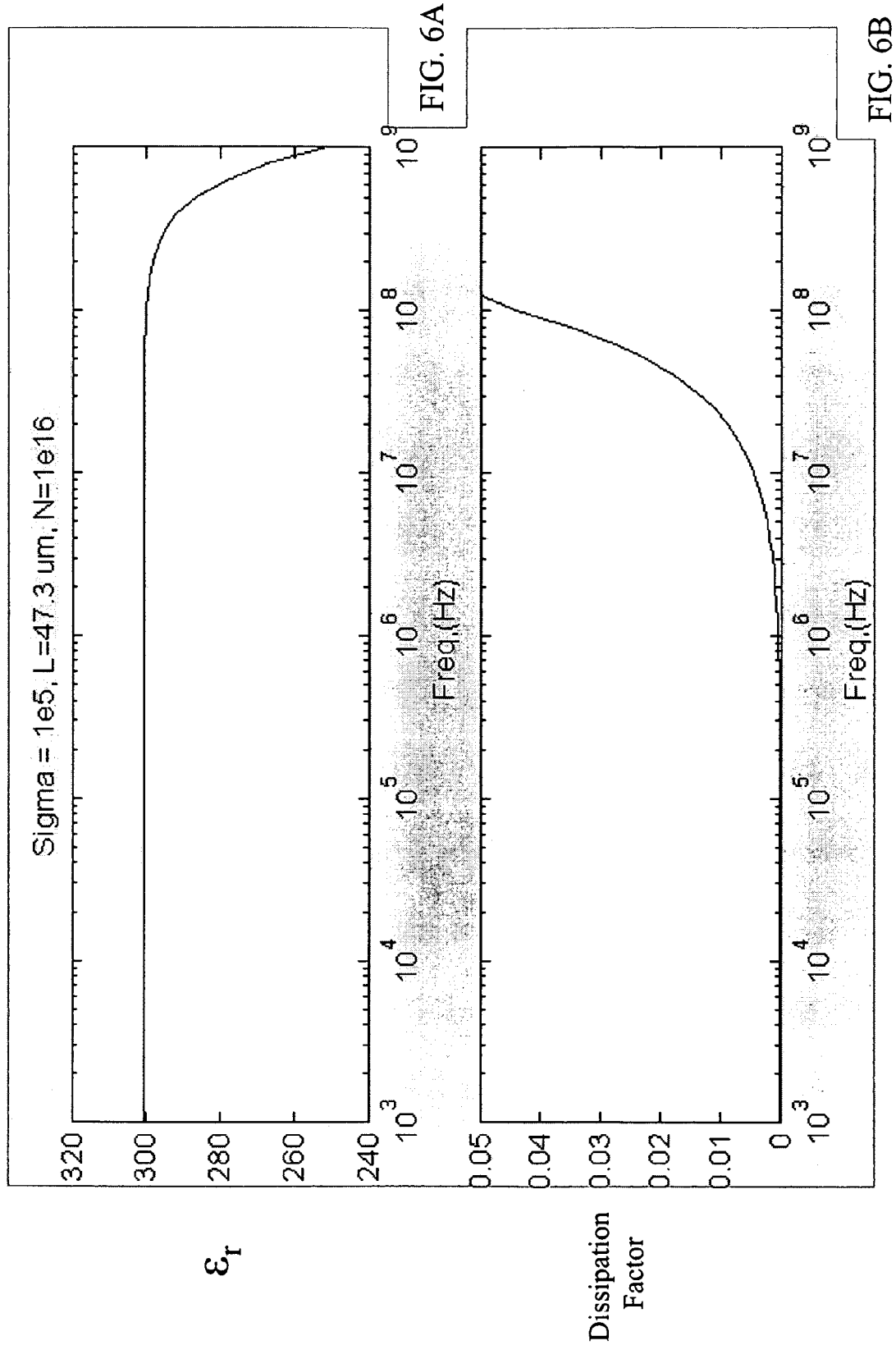
FIG. 6A provides a chart of $\in_r$ for an artificial dielectric with nanowires when σ equals $1e^5$, the nanowire length is 47.3 μm and the density is $1e^{15}$ nanowires/cm$^3$.
FIG. 6B provides a chart of the dissipation factor for an artificial dielectric with nanowires when σ equals $1e^5$, the nanowire length is 47.3 μm and the density is $1e^{15}$ nanowires/cm$^3$.

FIGS. 6A and 6B provide charts of $\in_r$ and the dissipation factor, respectively, when the conductivity, σ, equals $1e^5$, the nanowire length is 47.3 μm and the density is $1e^{15}$ nanowires/cm$^3$. The charts illustrate the value of $\in_r$ and the dissipation factor over a range of frequencies. FIG. 6B shows that at a frequency of about 10 Mhz the dissipation factor begins to rise significantly, and reaches a dissipation factor value of 0.05 at about 100 Mhz. The significance of this is that for this set of factors an $\in_r$ of 300 is attainable with a reasonable dissipation factor up to about 100 Mhz.

FIGS. 7A and 7B provide charts of $\in_r$ and the dissipation factor, respectively, when σ equals $1e^5$, the nanowire length is 20.7 μm and the density is $1e^{17}$ nanowires/cm$^3$. The charts illustrate the value of $\in_r$ and the dissipation factor over a range of frequencies. FIG. 7B shows that at a frequency of about 50 Mhz the dissipation factor begins to rise significantly, and reaches a dissipation factor value of 0.05 at about 500 Mhz. The significance of this is that for this set of factors an $\in_r$ of 300 is attainable with a reasonable dissipation factor up to about 500 Mhz.

FIGS. 8A and 8B provide charts of $\in_r$ and the dissipation factor, respectively, when a equals $1e^5$, the nanowire length is 8.97 μm and the density is $1e^{18}$ nanowires/cm$^3$. The charts illustrate the value of $\in_r$ and the dissipation factor over a range of frequencies. FIG. 8B shows that at a frequency of about 100 Mhz the dissipation factor begins to rise significantly, and reaches a dissipation factor value of 0.05 at about 1 Ghz. The significance of this is that for this set of factors an $\in_r$ of 300 is attainable with a reasonable dissipation factor up to about 1 Ghz.

Figures 9A, 9B:
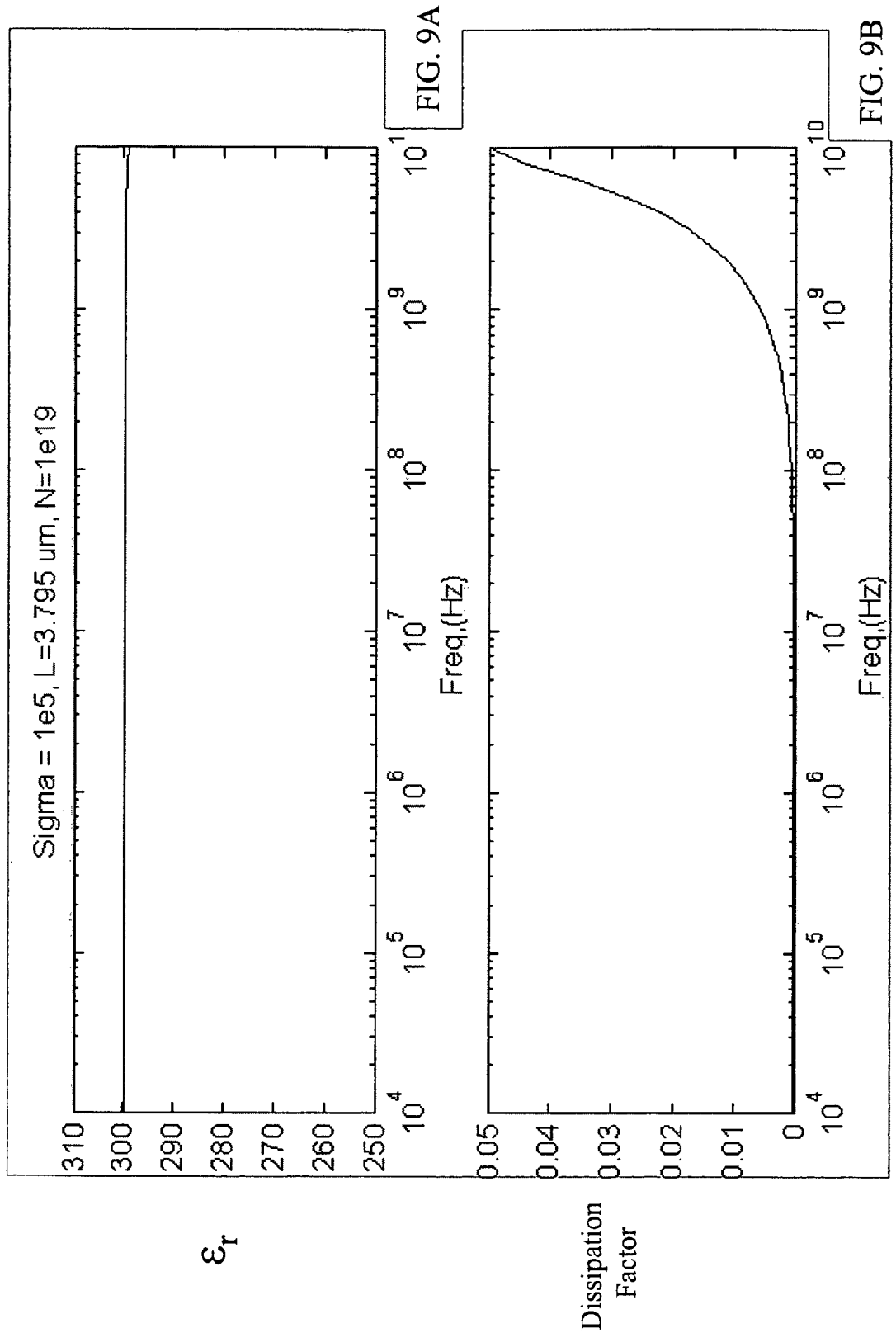
FIG. 9A provides chart of $\in_r$ for an artificial dielectric using nanowires when a equals $1e^5$, the nanowire length is 3.795 μm and the density is $1e^{19}$ nanowires/cm$^3$.
FIG. 9B provides chart of the dissipation factor for an artificial dielectric using nanowires when a equals $1e^5$, the nanowire length is 3.795 μm and the density is $1e^{19}$ nanowires/cm$^3$.

FIGS. 9A and 9B provide charts of $\in_r$ and the dissipation factor, respectively, when a equals $1e^5$, the nanowire length is 3.795 μm and the density is $1e^{19}$ nanowires/cm$^3$. The charts illustrate the value of $\in_r$ and the dissipation factor over a range of frequencies. FIG. 9B shows that at a frequency of about 500 Mhz the dissipation factor begins to rise significantly, and reaches a dissipation factor value of 0.05 at about 10 Ghz. The significance of this is that for this set of factors an $\in_r$ of 300 is attainable with a reasonable dissipation factor up to about 10 Ghz.

Collectively, the charts illustrated in FIGS. 6-9 show that at 10 Ghz, $\in_r=300$ that low loss operation requires relatively short nanowires and high densities of nanowires. The charts further demonstrate that low loss region extends higher in frequency for denser and shorter mixtures of nanowires embedded within a dielectric material. FIGS. 6-9 focus on artificial dielectric considerations that most likely would have component applications (e.g., capacitors, thin film transistors, microstrips, SAW filters, etc).

Figure 10:
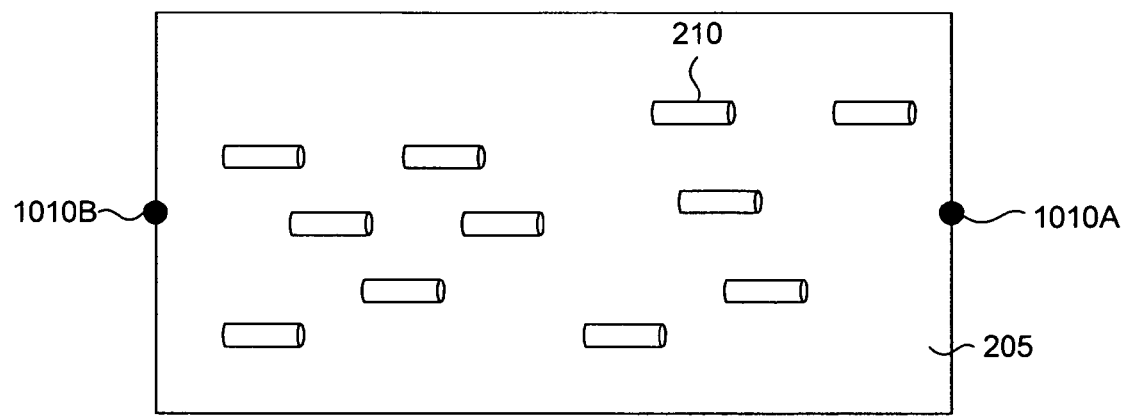
FIG. 10 provides a diagram of an artificial dielectric using nanowires including electrodes, according to an embodiment of the present invention.

FIG. 10 illustrates artificial dielectric 1000 including electrodes, according to an embodiment of the present invention. Artificial dielectric includes dielectric material 205, nanowires, such as nanowire 210, and electrodes 1010A and 1010B. As discussed above, a voltage can be applied across electrodes 1010A and 1010B to dynamically adjust the dielectric constant. Many different configurations of an artificial dielectric with electrodes are possible. For example, plates can be positioned along portions or entire edges of an opposite sides of artificial dielectric. Plates also may be positioned in a manner similar to those illustrated in FIG. 3. Other configurations will be apparent to individuals skilled in the relevant arts based on the teachings herein.

Artificial dielectrics with nanowires can also be used for shielding applications or radar absorbing materials (RAM). In these applications a have high loss within the artificial dielectric is desirable. Depending on the other characteristics of the artificial dielectric, the loss characteristics of a film of the artificial dielectric can be controlled. For example, one artificial dielectric composition could be transparent at optical wavelengths, so the material is clear and therefore well camouflaged when spread over the ground. This same material could also be made to be transparent to the frequencies that it is being probed with if they are not optical (e.g., RF frequencies).

In another example, the artificial dielectric coating could be made to be absorptive to a probe wavelength. Alternatively, the artificial dielectric coating can be formulated to be a low observable radar material until an electric field is applied, at which time the artificial dielectric material will reflect a given wavelength or set of wavelengths.

Moreover, the reflection coefficient of a material could be greatly increased by embedding the material between two layers of 50% and 100% reflectivity. If the phase through the artificial dielectric is 90 degrees the front and rear reflections cancel. If the phase is not 90 degrees, then they cancel imperfectly. Achieving ten percent modulation depth is likely to be straightforward. Also, these could be used as the surfaces of a corner cube, so the reflection would only occur back towards the emitter, and the strength would be much higher. Nanowires can be coated on the sides of a corner cube, or embedded between reflective or partially reflective layers. They can be part of an optical system (e.g., between combinations of quarter-wave or half wave plates and reflectors to make a circularly polarized reflector.)

Figure 11:
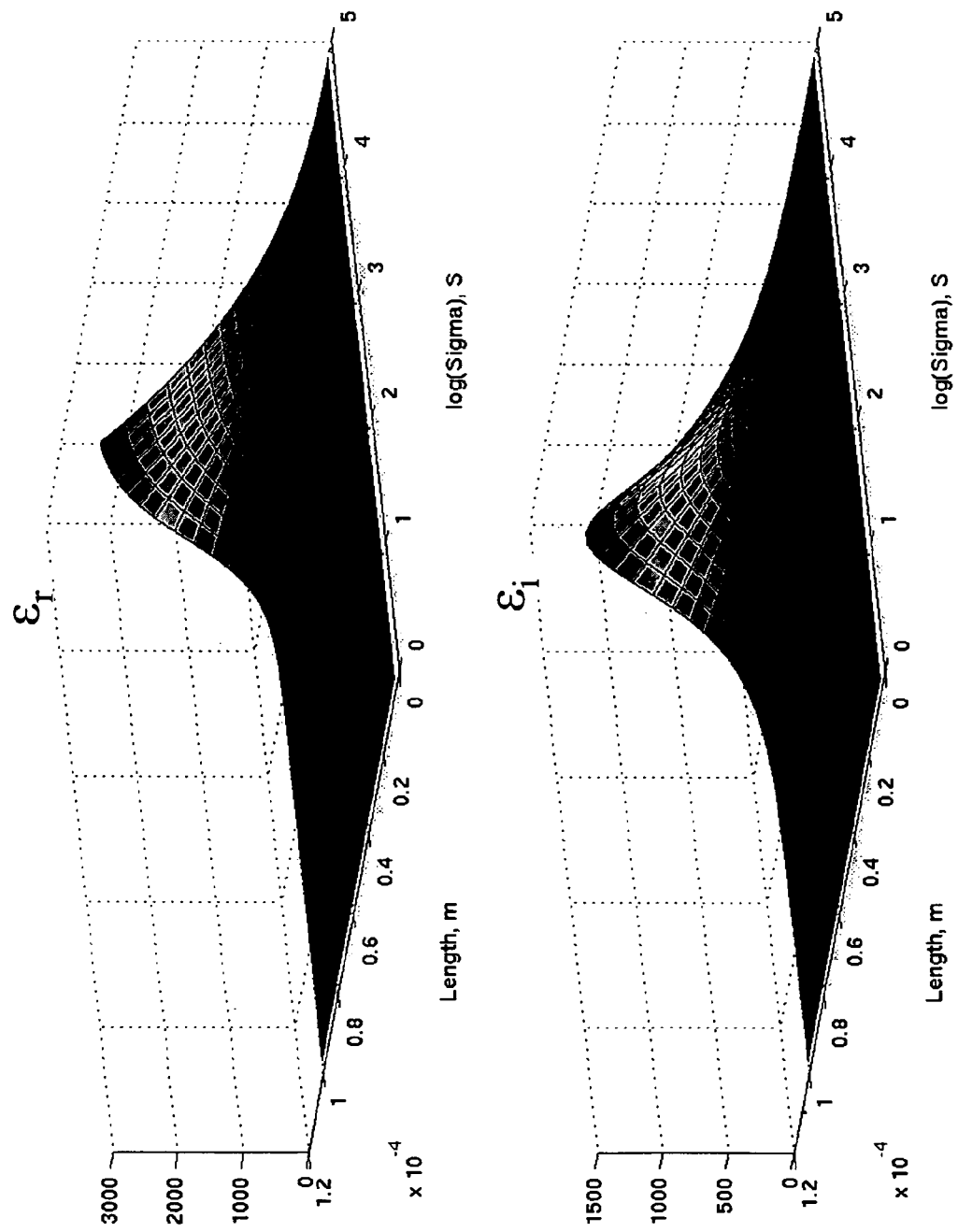
FIG. 11 provides a chart showing dielectric constant and loss characteristics for an artificial dielectric using nanowires for use in shielding and RAM applications, according to an embodiment of the invention.

FIG. 11 provides dielectric constant and loss characteristics for an artificial dielectric using nanowires for use in shielding and RAM applications, according to an embodiment of the invention. As indicated above, very high dielectric coefficients can be achieved. FIG. 11 provides data for artificial dielectrics that would more likely be used in such applications as stealth coatings and other RAM materials. FIG. 11 provides plots of $\in_r$ and $\in_i$ for an artificial dielectric in which there are $10^{16}$ nanowires/m$^3$ over a range of conductivities and nanowire lengths. The nanowires are 100 nm in diameter.

The charts show $\in_r$ and $\in_i$ over a wide range of nanowire lengths and conductivities. Nanowire length is plotted along the x-axis, conductivity is plotted along the y-axis and $\in_r$ and $\in_i$ are plotted along a z-axis. The charts show that when the nanowires are heavily doped with a relatively high conductivity of $10^5$ S/m and have a length of about 100 microns that $\in_r$ is 2500 and $\in_i$ is 1400 at a particular frequency with a short wavelength. These represent a very high dielectric constant with a short wavelength and a very high loss. Thus, if one were trying to make a low observable radar coating for an airplane, for example, that absorbs radar waves the material would have tremendously high loss and could be mixed with a magnetic material that was also high loss. An incoming electromagnetic wave could be attenuated quickly in such a material because the impedance of the artificial dielectric and metal could be approximately matched. Additionally, by mixing the lossy magnetic material with the lossy artificial dielectric, such that the square root of the ratio of $\mu/\in_r$ is close to that of free space, reflections at the boundary between the coating and air can be eliminated to support stealth operation.

A simulation was conducted to demonstrate the use of artificial dielectrics using nanowires within RAM materials. In the simulation, a three layer stack or artificial dielectrics using nanowires that totaled 12 mm thick was assumed. The dielectric matrix used to create the artificial dielectric had an $\in_r=2.8$ and was a low loss material. It was also assumed that the dielectric matrix would have a magnetic permeability of 30. The nanowires that were embedded in the dielectric matrix to create the artificial dielectric were assumed to be 20 µm long, 100 nm diameter silicon doped nanowires. The nanowire volume fraction within the artificial dielectric was less than 1%. The substrate used was metal.

Figure 12:
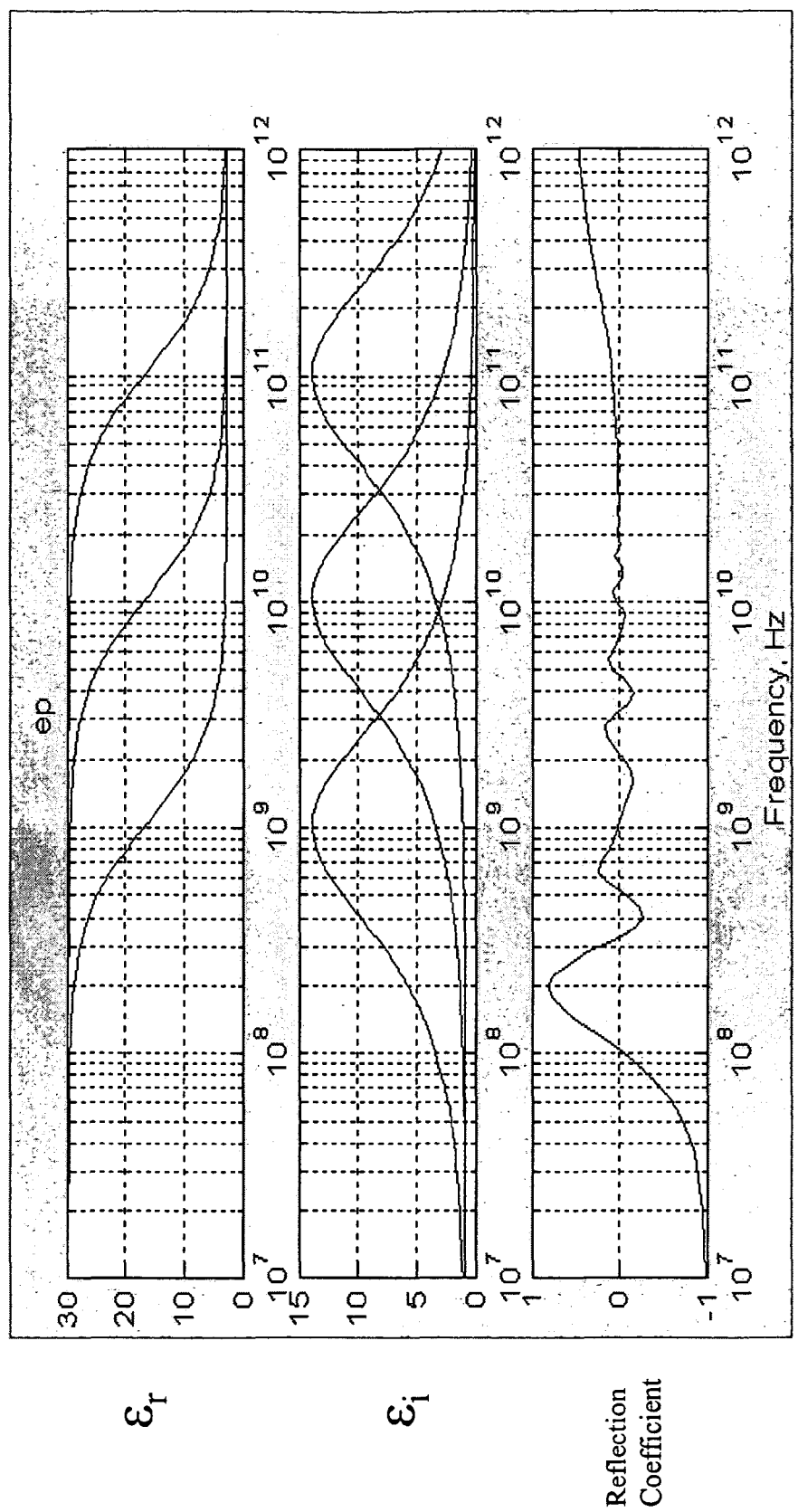
FIG. 12 provides a plot of $\in_r$, $\in_i$, and the reflection coefficient using a three layer stack of artificial dielectrics with nanowires, according to an embodiment of the invention.

FIG. 12 provides a plot of $\in_r$, $\in_i$, and the reflection coefficient using a the three layer stack arrangement described above. The key determination to note is that the reflection coefficient remains about 0 for frequencies above about 1 Ghz. In the plots for $\in_r$ and $\in_i$, the three curves correspond with each of the three layers in the stack.

Figure 13:
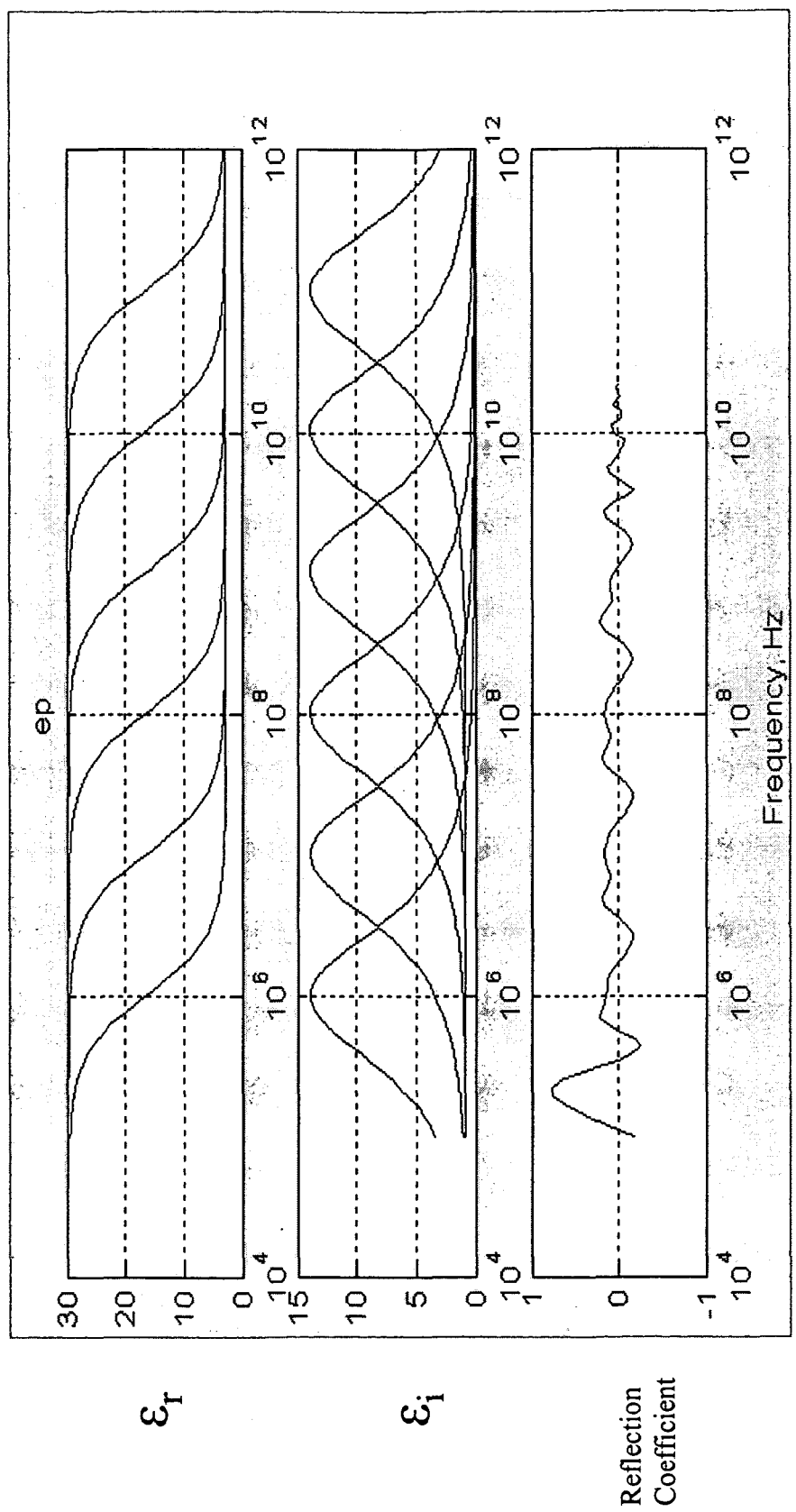
FIG. 13 provides a plot of $\in_r$, $\in_i$, and the reflection coefficient using a six layer stack of artificial dielectrics with nanowires, according to an embodiment of the invention.

FIG. 13 provides a similar plot of $\in_r$, $\in_i$, and the reflection coefficient using a six layer stack arrangement with the same parameters as above. In this case the total thickness would be approximately 24 mm. The key point to observe within FIG. 13 is that the reflection coefficient remains closer to 0 than in the three layer simulation, and is about 0 for frequencies above about 1 Mhz. In the plots for $\in_r$ and $\in_i$, the six curves correspond with each of the six layers in the stack.

Figure 14:
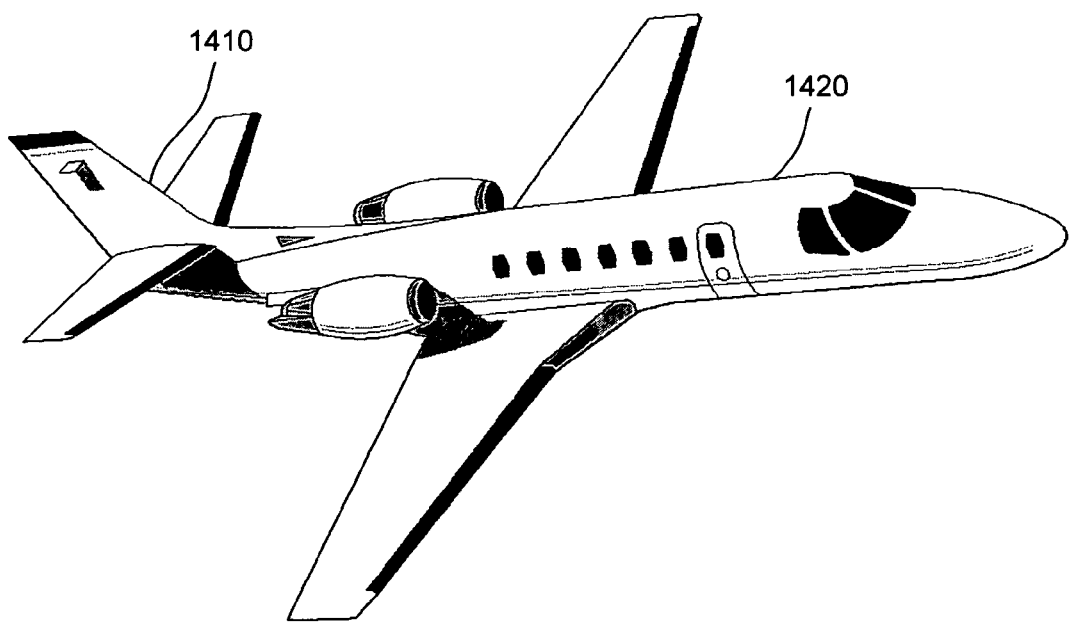
FIG. 14 provides a diagram of an aircraft with a portion of the aircraft coated with a RAM that contains a controllable artificial dielectric using nanowires, according to an embodiment of the invention.

FIG. 14 illustrates aircraft 1400 with a portion of the aircraft coated with a RAM that contains a controllable artificial dielectric using nanowires, according to an embodiment of the invention. Aircraft 1400 is primarily covered with RAM coating 1410. RAM coating 1410 can be a traditional RAM material or a RAM material that includes an artificial dielectric using nanowires as described with respect to FIGS. 12 and 13. RAM coating 1420 is a RAM material using a controllable artificial dielectric using nanowires. The reflectivity of RAM coating 1420 can be adjusted by applying an electric field to the artificial dielectric using nanowires. RAM coating 1420 would typically be used as a coating over areas in which aircraft 1400 had signal transmitting and/or receiving equipment. FIG. 14 illustrates RAM coating 1420 along a side of aircraft 1400. This position is not intended to limit the invention. RAM coating 1420 could be located in a wide variety of positions including, but not limited to the tail or nose of an aircraft.

When aircraft 1400 does not need to transmit or receive particular type or types signals, no electric field would be applied to RAM coating 1420. When aircraft 1400 needs to transmit or receive such a signal or signals, an electric field could be applied to the artificial dielectric using nanowires within RAM coating 1420 to change the reflectivity of RAM coating 1420 to momentarily permit the signal or signals to be sent or received. This allows aircraft 1420 to transmit and receive a signal or signals at one or more frequencies (e.g., the electric field could be adjusted so that signals would be transmitted at random frequencies), while minimizing the likelihood of being detected and maintaining stealth operation. The RAM coating using a controllable artificial dielectric using nanowires could be applied to a wide range of vehicles (e.g., aircraft, ships, trucks, tanks, etc.) or enclosures (e.g., secure bunkers, radar sites, etc.).

Methods of Making Devices with Artificial Dielectrics using Nanowires

The scope of the invention covers many methods of making devices using artificial dielectrics using nanowires. For the ease of illustration, only two methods are described herein. These are not intended to limit the scope of the application, but rather demonstrate the broad scope of the invention.

Figure 15:
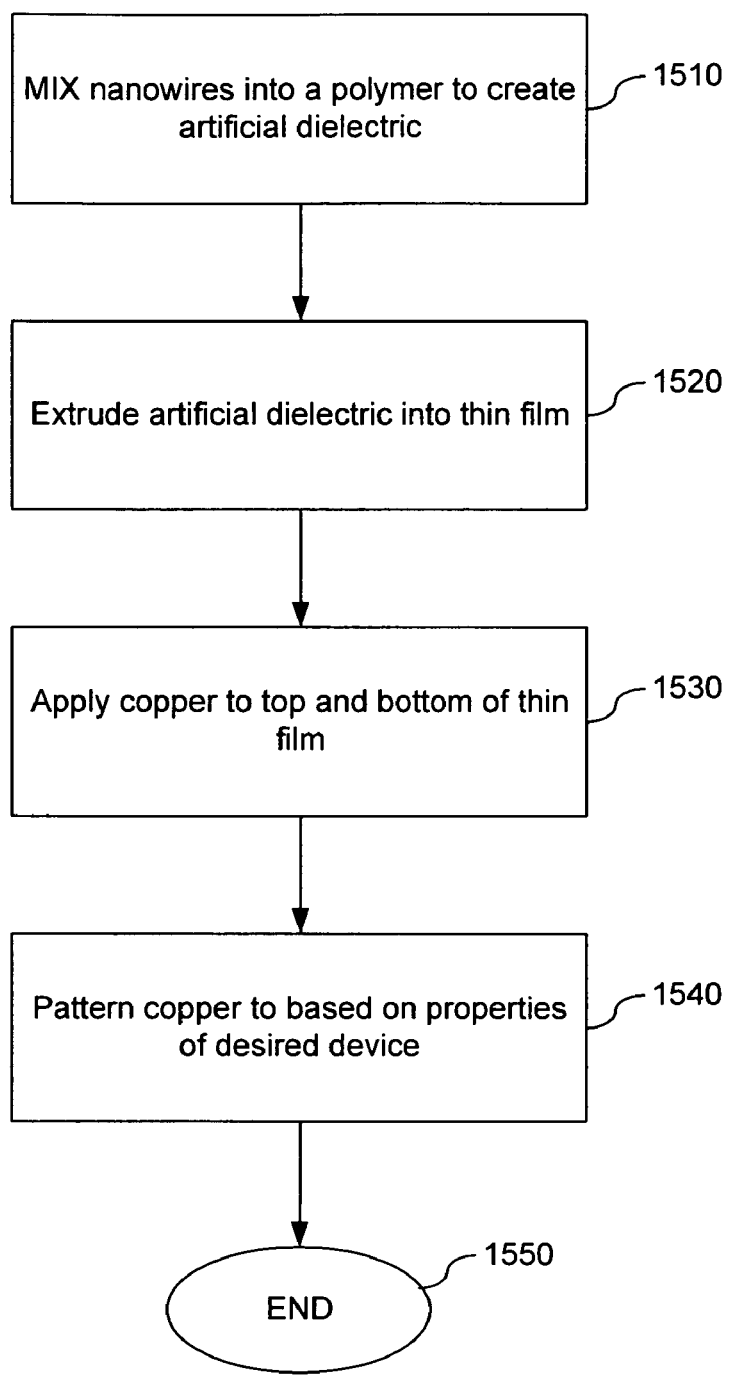
FIG. 15 provides a flowchart of a method for creating electronic devices with artificial dielectrics using nanowires, according to an embodiment of the invention.

Many methods of making devices using artificial dielectrics using nanowires. FIG. 15 provides a method 1500 for creating electronic devices with artificial dielectrics using nanowires, according to an embodiment of the invention. Method 1500 could be used to create devices such as microstrip filters, SAW filters, capacitors and the like onto a circuit board for use in a wide variety of applications, such as cell phones, wireless communications cards and the like.

Method 1500 begins in step 1510. In step 1510 nanowires are mixed into a polymer to create an artificial dielectric with nanowires. The specific types of nanowires, along with the density, diameter, doping and other characteristics would be determined based on the specific application and charts similar to those presented in FIG. 6 above, for example. In step 1520, the artificial dielectric is extruded into a thin film. In step 1530 copper (or other conductor) is applied to the top and bottom of the thin film. In step 1540 the copper is patterned based on the properties of the desired device to be produced. In step 1550, method 1500 ends.

Figure 16:
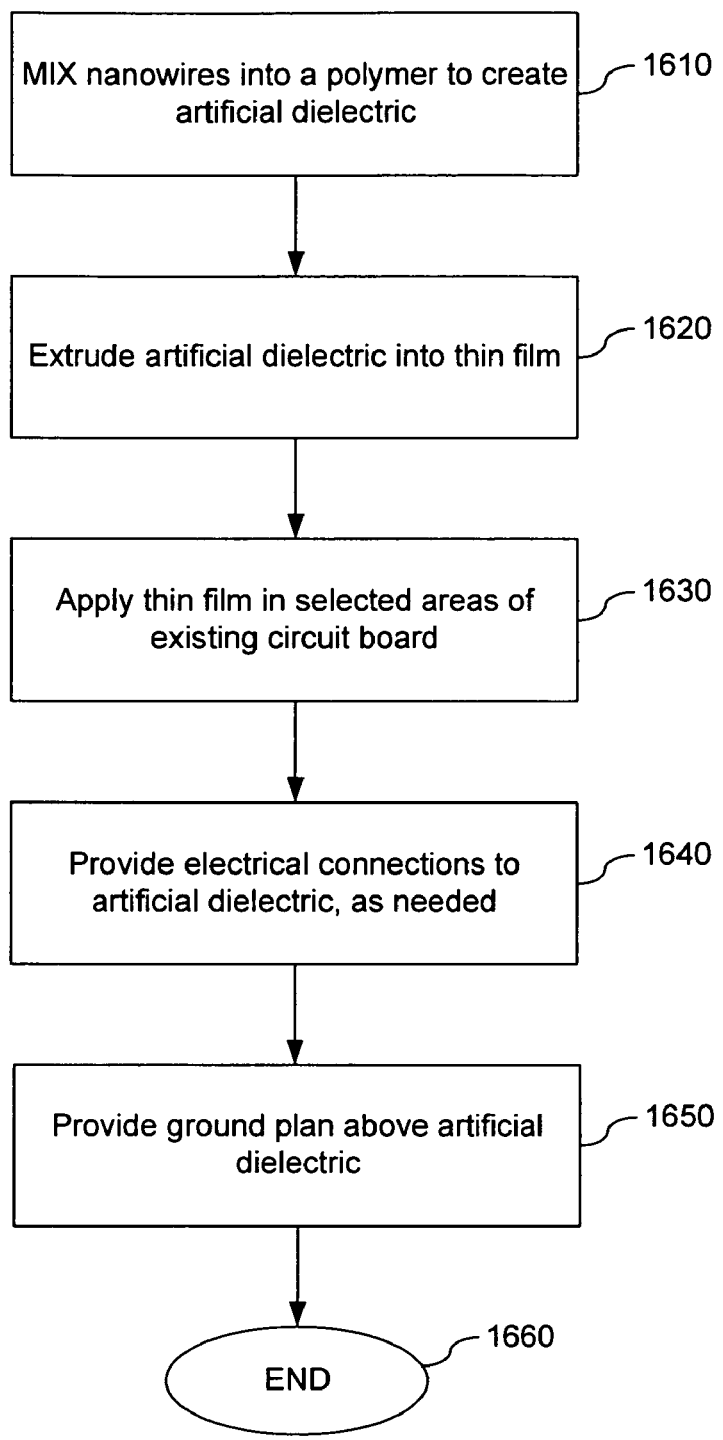
FIG. 16 provides a method for creating electronic devices with artificial dielectrics using nanowires on an existing circuit board, according to an embodiment of the invention.

FIG. 16 provides method 1600 for creating electronic devices with artificial dielectrics using nanowires on an existing circuit board, according to an embodiment of the invention. Method 1600 could be used to create devices such as microstrip filters, SAW filters, capacitors and the like onto a circuit board for use in a wide variety of applications, such as cell phones, wireless communications cards, and the like.

Method 1600 begins in step 1610. In step 1610 nanowires are mixed into a polymer to create an artificial dielectric with nanowires. The specific types of nanowires, along with the density, diameter, doping and other characteristics would be determined based on the specific application and charts similar to those presented in FIG. 6 above, for example. In step 1620, the artificial dielectric is extruded into a thin film. In step 1630 the thin film of artificial dielectric with nanowires is applied to selected areas of an existing circuit board where devices using the artificial dielectric are desired. In step 1640 electrical connections are provided to the areas where the artificial dielectric was applied, as needed. In step 1650 a optional ground plane is provide above the artificial dielectric. In some embodiments, the ground plan could simply be the casing of the device, for example, a cell phone enclosure. In step 1660, method 1600 ends.

Continuously Variable Graded Artificial Dielectrics Using Nanostructures

An existing problem with the use of dielectrics occurs when seeking to vary the dielectric response within a device. Specifically, when attempting to obtain a variable dielectric response across a device, changing the dielectric response requires either or both of abrupt changes in the dielectric material or in the shape of the dielectric material. The abrupt changes often result in additional losses in energy or signal which are not intended or desirable.

An embodiment of the present invention provides for the local adjustment of the response of dielectric materials by varying the one or more characteristics of nanostructures embedded in a dielectric material to produce a graded artificial dielectric. When embedded into the dielectric materials, one or more characteristics (e.g., density of the nanostructures, orientation of the nanostructures, length/oxide ratio of the nanostructures) of the nanostructures are spatially varied to produce permittivity of the graded artificial dielectric that is spatially varied without discontinuous dielectric boundaries. Such a graded artificial dielectric provides for the spatial variation of material properties without the concomitant variation in the physical shape of the material.

When the nanostructures are spatially varied in such a way that discontinuous dielectric boundaries are reduced or eliminated, cavity effects and fresnel-like interface losses are minimized. At the same time varying or adjusting the spatial variation of the permittivity enables filters, delay lines, lenses, and the like to be fabricated without abrupt boundaries between dielectrics. Furthermore, refractive lenses could be fabricated from planar surfaces rather than complex curves dictated by Snell's law.

Figure 17:
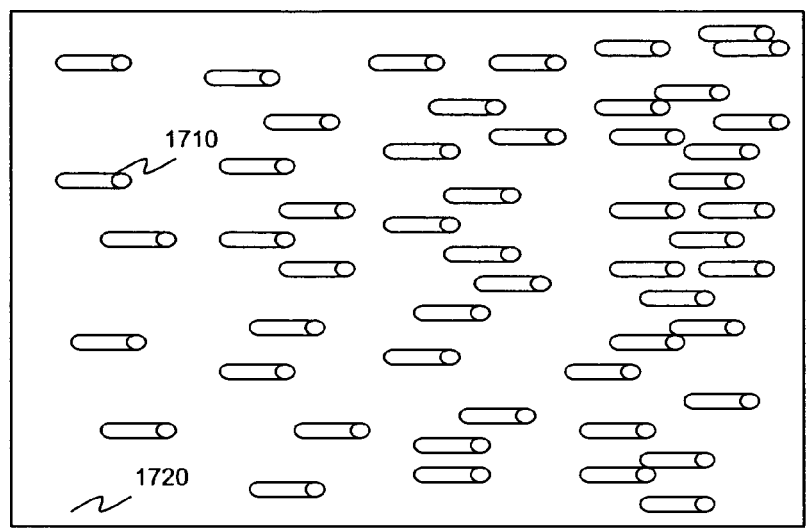
FIG. 17 provides a diagram of a graded artificial dielectric, according to an embodiment of the invention.
Figure 18:
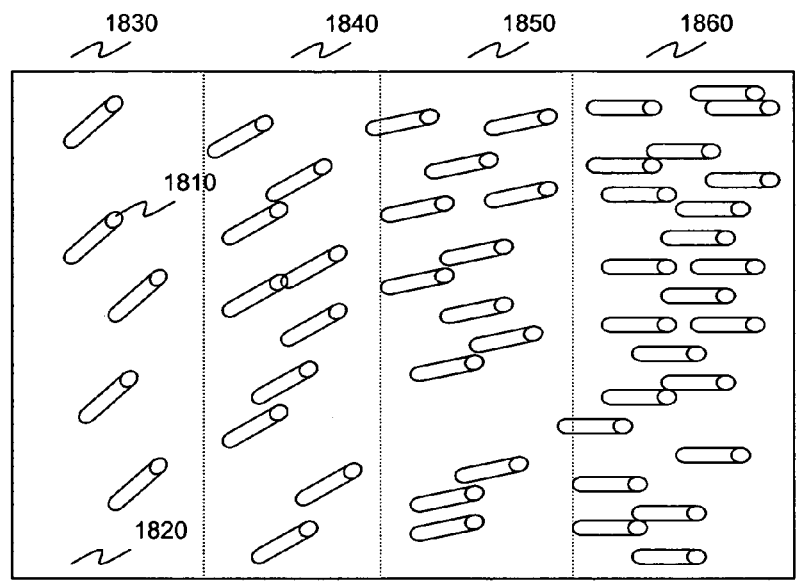
FIG. 18 provides a diagram of a graded artificial dielectric having two varying characteristics, according to an embodiment of the invention.
Figure 19:
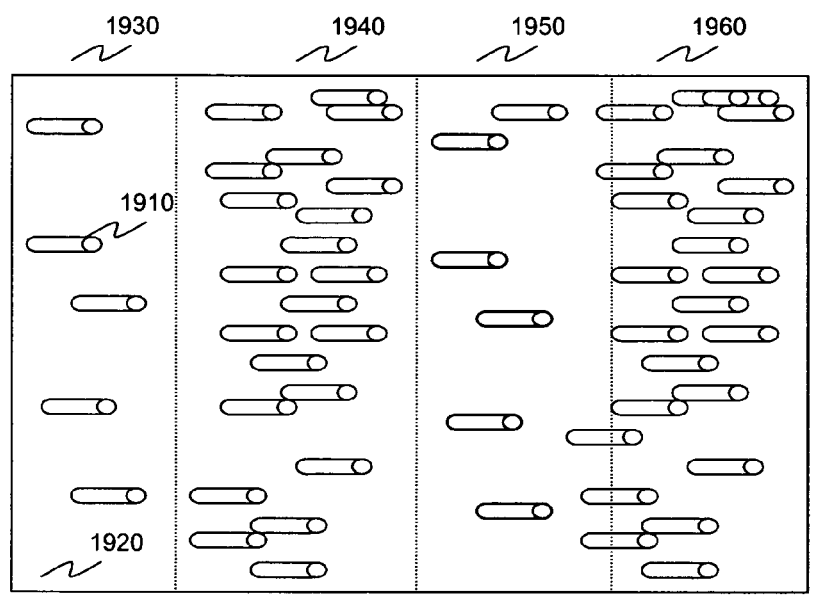
FIG. 19 provides a diagram of a graded artificial dielectric having periodically varying characteristics, according to an embodiment of the invention.

FIGS. 17-19 provide exemplary diagrams of various ways in which nanostructure characteristics can be varied within a dielectric material to form a graded artificial dielectric. Nanostructure characteristics that can be varied include one or more of nanostructure density (e.g., the volume of nanostructures relative to the volume of dielectric material), nanostructure length, nanostructure aspect ratio, nanostructure oxide ratio, and nanostructure alignment. FIGS. 17-19 illustrate examples of selected characteristics being varied. These figures are not intended to limit the scope of the invention to the examples provided.

FIG. 17 provides a diagram of graded artificial dielectric 1700, according to an embodiment of the invention. Graded artificial dielectric 1700 includes dielectric 1720 and a plurality of nanostructures, such as nanostructure 1710. The density of nanostructures varies from left to right within graded artificial dielectric 1700, such that the density of the nanostructures is greater on the right side as compared to the density on the left side of graded artificial dielectric. In an embodiment the density increases without discontinuous dielectric boundaries. The nanostructures are illustrated as being aligned in graded artificial dielectric 1700. In other embodiments, the nanostructures do not need to be aligned. In fact, the orientation of the nanostructures can be varied to also provide for a continuous variation of the permittivity across a graded artificial dielectric.

Figure 20:
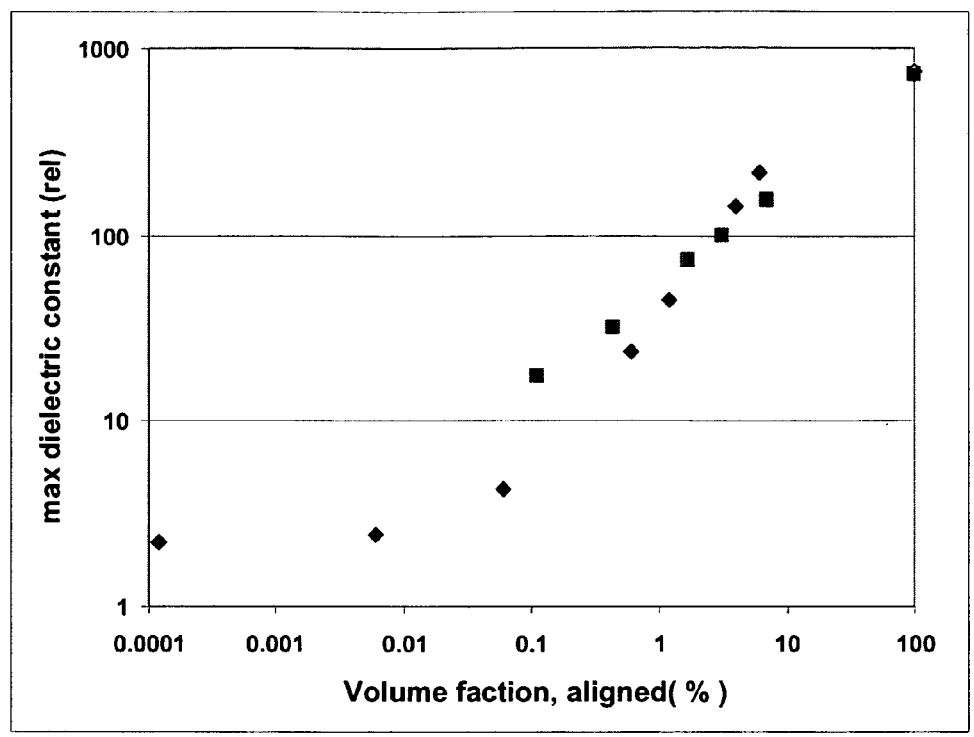
FIG. 20 provides a chart illustrating the relative maximum dielectric constant as a function of the density of nanostructures within a dielectric, according to an embodiment of the invention.

FIG. 20 provides a chart illustrating the relative maximum dielectric constant as a function of the density of nanostructures within a dielectric, according to an embodiment of the invention. The chart illustrates that with a low density of nanostructures, such as 0.0001 percent that the relative dielectric constant is small. When the density of the nanostructures is increased to 10 percent the dielectric constant increases significantly to about 100 times what it would be in the absence of the nanostructures. The chart also illustrates that a roughly linear relationship exists for the relative artificial dielectric as a function of the density of the nanostructures over the range from about 0.01 percent nanostructures to 10 percent nanostructures.

The nanostructures can be embedded in a wide range of dielectric materials, including but not limited to solid dielectrics, such as plastics, metal oxides, glasses, semiconductors (e.g., silicon), and pure single crystals (e.g., diamond, sapphire, quartz) as well as those described above and in R. Bartnikas, *Dielectrics and Insulators*, in The Electrical Engineering Handbook 1143-1150 (Michael C. Dorf, ed. CRC Press 1993). The dielectric materials can include both liquid and solid dielectric materials. The dielectric material may include one or more fillers such as fine particle sized powdered materials (e.g., mica, silica, glass, and wood flour) to improve physical properties, or may be made from a composite or mixture of materials formulated to a specific dielectric constant or loss tangent, for example.

In embodiments the nanostructures can be metals, silicon, semiconductors or other materials and material combinations as described above for nanowires, nanorods, nanotubes, nanotetrapods, or nanoribbons. The nanostructures can be embedded in a dielectric in the form of a matrix or in a thin film. The nanostructures can be distributed within the artificial dielectric isotropically or anisotropically. In embodiments, the nanostructures are smaller than the wavelength of an incident electromagnetic radiation to realize smoothly varying periodic and aperiodic structures. Specifically, in the case of nanowires or nanorods, the size of the rods or wires must be smaller than the electromagnetic wavelength to be controlled and the metal/semiconductor layers must be such that any non-ideal conductivity does not significantly alter the desired performance characteristics, as will be known by individuals skilled in the relevant arts based on the teachings herein.

In embodiments, an insulator can be used to coat the nanostructure to avoid the percolation problems of artificial dielectrics that use metalized fibers. When silicon nanowires are used, for example, a silicon oxide insulator can be created around the nanowire, as illustrated in FIG. 1C, for example.

FIG. 18 provides a diagram of graded artificial dielectric 1800 having two varying characteristics, according to an embodiment of the invention. Graded artificial dielectric 1800 includes dielectric 1820 and nanostructures, such as nanostructure 1810. Dielectric 1820 has the same properties as dielectric 1720 and nanostructures 1810 have the same properties as nano structures 1710.

In this embodiment, both the density and orientation of the nanostructures are varied from the left to right of graded artificial dielectric 1800. In particular, for illustration purposes, graded artificial dielectric 1800 is divided into four regions from left to right. These are regions 1830, 1840, 1850 and 1860. Within region 1830 the density of the nanostructures is low while the orientation of the nanostructures is about 45 degrees from a horizontal centerline passing through artificial dielectric 1820. Within region 1840 the density increasing slightly and the orientation shifts to about 30 degrees. Within region 1850 the density increases again the orientation shifts to about 15 degrees. Finally, within region 1860 the density increases again and the orientation shifts to having the nanostructures parallel with a horizontal centerline. Note that the regions are arbitrarily chosen for the purpose of illustration. Ideally the orientation and density will change gradually and continuously across the dielectric to avoid or minimize discontinuous dielectric boundaries.

FIG. 19 provides a diagram of graded artificial dielectric 1900 having periodically varying characteristics, according to an embodiment of the invention. Graded artificial dielectric 1900 includes dielectric 1920 and nanostructures, such as nanostructure 1910. Dielectric 1920 has the same properties as dielectric 1720 and nanostructures 1910 have the same properties as nanostructures 1710.

In this embodiment, density of the nanostructures varies periodically from the left to right of graded artificial dielectric 1900. In particular, for illustration purposes graded artificial dielectric 1900 is divided into four regions from left to right. These regions are 1930, 1940, 1950 and 1960. Within regions 1930 and 1950, the density of the nanostructures is relatively low, while within regions 1940 and 1960, the density of the nanostructures is relatively high. This creates a periodically varying dielectric response. Note that the regions are artificial for the purpose of illustration, ideally the density will change gradually at the region interfaces to avoid or minimize discontinuous dielectric boundaries.

Figure 21:
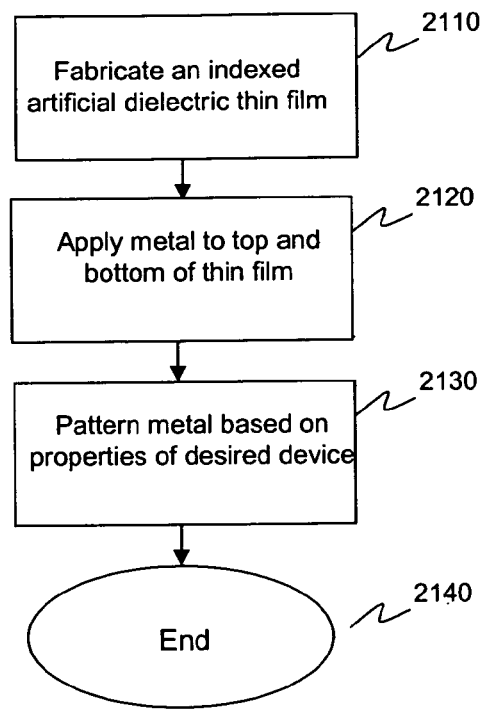
FIG. 21 provides a method for creating electronic devices with artificial dielectrics using nanostructures, according to an embodiment of the invention.

FIG. 21 provides a flowchart of method 2100 for creating electronic devices with artificial dielectrics using nanostructures, according to an embodiment of the invention. Method 2100 can be used to create devices such as microstrip filters, SAW filters, capacitors and the like onto a circuit board for use in a wide variety of applications, such as cell phones, wireless communications cards and the like.

Method 2100 begins in step 2110. In step 2110 nanostructures are embedded in a dielectric to create a thin film of a graded artificial dielectric, such as graded artificial dielectrics 1700, 1800 or 1900, for example. The nanostructures are embedded in such a way that one or more characteristics of the nanostructures are spatially varied to produce permittivity of the graded artificial dielectric that is spatially varied. Preferably the nanostructures are varied in such a way that discontinuous dielectric boundaries are not created.

A variety of methods can be used to embed the nanostructures into the dielectric. In one embodiment, a set of artificial dielectrics can be created by mixing nanostructures having different characteristics into a dielectric material. In this method, each artificial dielectric would be created such that one or more of the characteristics of the nanostructures differs across each of the artificial dielectrics that are formed. For example, referring back to FIG. 18, four separate artificial dielectrics might be created that correspond to regions 1830, 1840, 1850, and 1860. As discussed above each of these regions has a different nanostructure density and orientation. Once the separate artificial dielectrics are created, they can then be fused together to form graded artificial dielectric 1800. The fusing process would have the desirable effect of causing some migration of nanostructures across the interfaces between the different artificial dielectric regions to reduce discontinuous dielectric effects at the interfaces. Once fused together, the graded artificial dielectric can be further manipulated into a thin film, as will be known by individuals skilled in the relevant arts.

In another approach, a method akin to providing layers of paint can be used. In this approach, nanostructures having different characteristics can be mixed within dielectric materials to form solutions of nanostructures and dielectric material. Multiple solutions are created in which the nanostructure characteristics are varied. Once the solutions are prepared, layers of the different solutions are applied. For example, referring to FIG. 18, a layer corresponding to region 1830 is applied, followed by a layer corresponding to region 1840 and so on. As the layers are applied, there is some diffusion of nanostructure solutions across boundaries between the regions. The amount of diffusion could be regulated based on the drying times between applying layers. The diffusion has the desirable impact of reducing dielectric discontinuities.

In a third approach, similar to the second approach, a dip method can be used. In this approach, nanostructures having different characteristics can be mixed with dielectric materials to form solutions of nanostructures and dielectric material. Multiple solutions are created in which the nanostructure characteristics are varied. In the approach, rather than applying layers of different nanostructure/dielectric material solution on top of each other, a dipping method is used. A substrate is dipped into a first solution of nanostructures and dielectric material in which the nanostructures have a first characteristic. The substrate is then dipped into a second solution of nanostructures and dielectric material and so on until the desired graded artificial dielectric is achieved. In an embodiment, the graded artificial dielectric is then removed from the substrate and formed into a thin film.

In step 2120 copper (or other conductor) is applied to the top and bottom of the thin film of graded artificial dielectric. The conductor can also be embedded within the dielectric. In step 2130 the copper is patterned based on the properties of the desired device to be produced. In step 2140, method 2100 ends.

Figure 22:
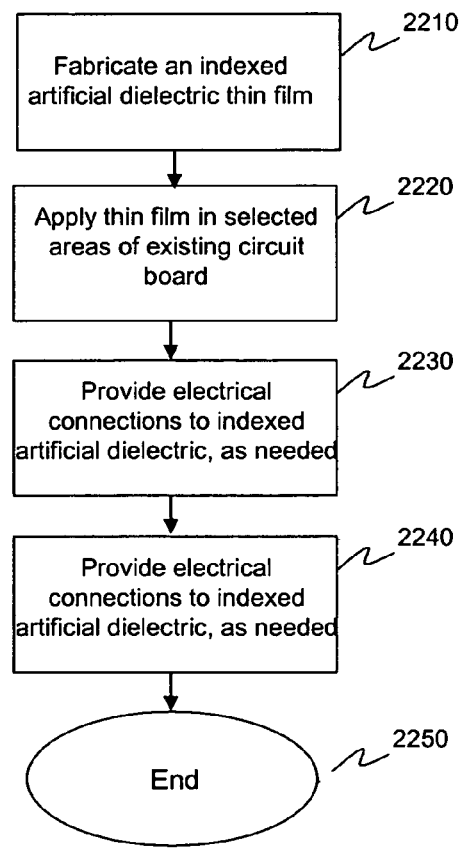
FIG. 22 provides a method for creating electronic devices with artificial dielectrics using nanowires on an existing circuit board, according to an embodiment of the invention.

FIG. 22 provides method 2200 for creating electronic devices with artificial dielectrics using nanowires on an existing circuit board, according to an embodiment of the invention. Method 2200 can be used to create devices such as microstrip filters, SAW filters, capacitors and the like onto a circuit board for use in a wide variety of applications, such as cell phones, wireless communications cards, and the like.

Method 2200 begins in step 2210. In step 2210 nanostructures are embedded in a dielectric to create a thin film of a graded artificial dielectric, such as graded artificial dielectrics 1700, 1800 or 1900, for example. The nanostructures are embedded in such a way that one or more characteristics of the nanostructures are spatially varied to produce permittivity of the graded artificial dielectric that is spatially varied. Preferably the nanostructures are varied in such a way that discontinuous dielectric boundaries are not created. Step 2210 can be accomplished through the approaches discussed above with respect to step 2110.

In step 2220 the thin film of artificial dielectric with nanostructures is applied to selected areas of an existing circuit board where devices using the artificial dielectric are desired. In step 2230 electrical connections are provided to the areas where the artificial dielectric was applied, as needed. In step 2240 an optional ground plane is provide above the artificial dielectric. In some embodiments, the ground plane could simply be the casing of the device, for example, a cell phone enclosure. In step 2250, method 2200 ends.

In addition to the applications mentioned above, graded artificial dielectric materials have applications in structures such as antennas, waveguides, lenses and reflectors. For antennas, particularly chip antennas such as patch antennas, the very high dielectric materials achievable with these graded artificial dielectrics may be tapered to minimize Fresnel losses and cavity effects. For applications to transmission lines the smooth variation of various high dielectric graded artificial dielectrics results in short tuned stubs and low reflection interfaces to low dielectrics or free space transmission lines.

On the other hand periodic variations in transmission lines along the direction of travel allows the enhancement of reflection in both short period and long period filters, such as for example, Bragg filters and Bragg gratings. In lenses, microwave self-focusing lenses with short focal lengths are achieved without the necessity to form spherical curved surfaces or discrete material layering effects.

As mentioned above, graded artificial dielectrics can also be used to create devices such as microstrip filters, SAW filters, capacitors and the like onto a circuit board for use in a wide variety of applications, such as cell phones, wireless communications cards and the like. Graded artificial dielectrics can also be used in RAM devices.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A memory gate stack comprising a graded artificial dielectric, comprising:
    (a) a dielectric material;
    (b) a first region within the dielectric material with a plurality of nanostructures having one or more characteristics embedded therein; and
    (c) a second region within the dielectric material with a plurality of nanostructures having one or more characteristics embedded therein;
    wherein at least one of the one or more nanostructure characteristics is spatially varied from the first region to the second region, wherein the spatial variance is gradual and consistent from the first region to the second region.

2. The memory gate stack comprising the graded artificial dielectric of claim 1, wherein the characteristics of the nanostructures includes nanostructure density.

3. The memory gate stack comprising the graded artificial dielectric of claim 1, wherein the characteristics of the nanostructures includes nanostructure length, nanostructure aspect ratio, nanostructure oxide ratio, and nanostructure alignment.

4. The memory gate stack comprising the graded artificial dielectric of claim 1, further comprising at least a third region within the dielectric material with a plurality of nanostructures having one or more characteristics embedded therein, wherein the at least one spatially varied nanostructure characteristics is periodically varied throughout the dielectric material.

5. The memory gate stack comprising the graded artificial dielectric of claim 1, wherein the nanostructures are smaller than a wavelength of electromagnetic radiation that is incident upon the graded artificial dielectric.

6. The memory gate stack comprising the graded artificial dielectric of claim 1, wherein the nanostructures comprise nanowires.

7. The memory gate stack comprising the graded artificial dielectric of claim 6, wherein the nanowires comprise an insulating shell.

8. The memory gate stack comprising the graded artificial dielectric of claim 1, wherein the nanostructures comprise silicon nanowires.

9. The memory gate stack comprising the graded artificial dielectric of claim 8, wherein the nanowires comprise an insulating shell.

10. The memory gate stack comprising the graded artificial dielectric of claim 1, wherein the dielectric material comprises polyethylene, polypropylene, alumina or magnesium oxide.

11. The memory gate stack comprising the graded artificial dielectric of claim 1, wherein the dielectric material comprises an organic or inorganic matrix.

12. The memory gate stack comprising the graded artificial dielectric of claim 1, wherein the dielectric material comprises a thin film.

13. The memory gate stack comprising the graded artificial dielectric of claim 1, wherein the dielectric material comprises at least a first material, and the plurality of nanostructures comprise at least a second material, wherein the first material and the second material are different.

14. The memory gate stack comprising the graded artificial dielectric of claim 6, wherein the nanowires are encapsulated in a polymeric dielectric.

15. A memory gate stack comprising a graded artificial dielectric, comprising:
(a) a dielectric material;
(b) a first region within the dielectric material with a plurality of nanostructures embedded therein; and
(c) a second region within the dielectric material with a plurality of nanostructures embedded therein, wherein the density of the nanostructures is spatially varied from the first region to the second region such that the permittivity of the graded artificial dielectric spatially varied without a discontinuous dielectric boundary between the first region and the second regions.

16. The memory gate stack comprising the graded artificial dielectric of claim 15, wherein at least one of nanostructure length, nanostructure aspect ratio, nanostructure oxide ratio, and nanostructure orientation are also spatially varied from the first region to the second region.

17. The memory gate stack comprising the graded artificial dielectric of claim 15, further comprising at least a third region within the dielectric material with a plurality of nanostructures having one or more characteristics embedded therein, wherein the density of the nanostructures is periodically varied throughout the dielectric material.

18. The memory gate stack comprising the graded artificial dielectric of claim 15, wherein the nanostructures are smaller than a wavelength of electromagnetic radiation that is incident upon the graded artificial dielectric.

19. The memory gate stack comprising the graded artificial dielectric of claim 15, wherein the nanostructures comprise nanowires.

20. The memory gate stack comprising the graded artificial dielectric of claim 15, wherein the nanowires comprise an insulating shell.

21. The memory gate stack comprising the graded artificial dielectric of claim 15, wherein the nanostructures comprise silicon nanowires.

22. The memory gate stack comprising the graded artificial dielectric of claim 15, wherein the nanowires comprise an insulating shell.

23. The memory gate stack comprising the graded artificial dielectric of claim 15, wherein the dielectric material comprises polyethylene, polypropylene, alumina, or magnesium oxide.

24. The memory gate stack comprising the graded artificial dielectric of claim 15, wherein the dielectric material comprises an organic or inorganic matrix.

25. The memory gate stack comprising the graded artificial dielectric of claim 15, wherein the dielectric material comprises a thin film.

26. A memory gate stack comprising a graded artificial dielectric, comprising:
(a) a dielectric material;
(b) a first region within the dielectric material with a plurality of nanowires embedded therein; and
(c) a second region within the dielectric material with a plurality of nanowires embedded therein; wherein the orientation of the nanowires is spatially varied gradually from the first region to the second region such that the permittivity of the graded artificial dielectric is spatially varied without a discontinuous dielectric boundary between the first and second regions.

27. The memory gate stack comprising the graded artificial dielectric of claim 26, wherein at least one of the nanowire density, nanowire length, nanowire aspect ratio, and nanowire oxide ratio, are also spatially varied from the first region to the second region.

28. The memory gate stack comprising the graded artificial dielectric of claim 26, further comprising at least a third region within the dielectric material with a plurality of nanostructures having one or more characteristics embedded therein, wherein the orientation of the nanostructures is periodically varied throughout the dielectric material.

29. The memory gate stack comprising the graded artificial dielectric of claim 26, wherein the nanowires are smaller than a wavelength of electromagnetic radiation that is incident upon the graded artificial dielectric.

30. The memory gate stack comprising the graded artificial dielectric of claim 26, wherein the nanowires comprise an insulating shell.

31. The memory gate stack comprising the graded artificial dielectric of claim 26, wherein the nanowires are silicon nanowires.

32. The memory gate stack comprising the graded artificial dielectric of claim 26, wherein the nanowires comprise an insulating shell.

33. The memory gate stack comprising the graded artificial dielectric of claim 26, wherein the dielectric material comprises polyethylene, polypropylene, alumina or magnesium oxide.

34. The memory gate stack comprising the graded artificial dielectric of claim 26, wherein the dielectric material comprises an organic or inorganic matrix.

35. The memory gate stack comprising the graded artificial dielectric of claim 26, wherein the dielectric material comprises a thin film.

36. A memory gate stack comprising a graded artificial dielectric, comprising:
a dielectric material having a plurality of regions; and
a plurality of nanostructures having one or more characteristics embedded in the dielectric material;
wherein at least one of the one or more nanostructure characteristics is spatially varied between two or more different regions of the dielectric material such that the permittivity of the graded artificial dielectric is spatially varied without a discontinuous dielectric boundary between the two or more different regions.

37. The memory gate stack comprising the graded artificial dielectric of claim 36, wherein the at least one spatially varied nanostructure characteristics is periodically varied in the dielectric material.

* * * * *

UNITED STATES PATENT AND TRADEMARK OFFICE
CERTIFICATE OF CORRECTION

PATENT NO. : 8,089,152 B2
APPLICATION NO. : 11/589988
DATED : January 3, 2012
INVENTOR(S) : Miller It is certified that error appears in the above-identified patent and that said Letters Patent is hereby corrected as shown below:

In claim 1, column 22, line 5, please delete "memory" and insert --transistor--.
In claim 2, column 22, line 19, please delete "memory" and insert --transistor--.
In claim 3, column 22, line 22, please delete "memory" and insert --transistor--.
In claim 4, column 22, line 27, please delete "memory" and insert --transistor--.
In claim 4, column 22, beginning on line 31, please delete "characteristics" and insert --characteristic--.
In claim 5, column 22, line 34, please delete "memory" and insert --transistor--.
In claim 6, column 22, line 38, please delete "memory" and insert --transistor--.
In claim 7, column 22, line 41, please delete "memory" and insert --transistor--.
In claim 8, column 22, line 44, please delete "memory" and insert --transistor--.
In claim 9, column 22, line 47, please delete "memory" and insert --transistor--.
In claim 10, column 22, line 50, please delete "memory" and insert --transistor--.
In claim 11, column 22, line 54, please delete "memory" and insert --transistor--.
In claim 12, column 22, line 57, please delete "memory" and insert --transistor--.
In claim 13, column 22, line 60, please delete "memory" and insert --transistor--.
In claim 14, column 22, line 65, please delete "memory" and insert --transistor--.
In claim 15, column 23, line 1, please delete "memory" and insert --transistor--.
In claim 15, column 23, line 10, after "dielectrically", please insert --is--.
In claim 16, column 23, line 13, please delete "memory" and insert --transistor--.
In claim 17, column 23, line 18, please delete "memory" and insert --transistor--.
In claim 18, column 23, line 24, please delete "memory" and insert --transistor--.
In claim 19, column 23, line 28, please delete "memory" and insert --transistor--.
In claim 20, column 23, line 31, please delete "memory" and insert --transistor--.
In claim 21, column 23, line 34, please delete "memory" and insert --transistor--.
In claim 22, column 23, line 37, please delete "memory" and insert --transistor--.
In claim 23, column 23, line 40, please delete "memory" and insert --transistor--.
In claim 24, column 23, line 44, please delete "memory" and insert --transistor--.
In claim 25, column 23, line 47, please delete "memory" and insert --transistor--.

Signed and Sealed this
Tenth Day of July, 2012

David J. Kappos
*Director of the United States Patent and Trademark Office*

CERTIFICATE OF CORRECTION (continued)
U.S. Pat. No. 8,089,152 B2

In claim 26, column 23, line 50, please delete "memory" and insert --transistor--.
In claim 27, column 24, line 7, please delete "memory" and insert --transistor--.
In claim 28, column 24, line 12, please delete "memory" and insert --transistor--.
In claim 29, column 24, line 18, please delete "memory" and insert --transistor--.
In claim 30, column 24, line 22, please delete "memory" and insert --transistor--.
In claim 31, column 24, line 25, please delete "memory" and insert --transistor--.
In claim 32, column 24, line 28, please delete "memory" and insert --transistor--.
In claim 33, column 24, line 31, please delete "memory" and insert --transistor--.
In claim 34, column 24, line 35, please delete "memory" and insert --transistor--.
In claim 35, column 24, line 38, please delete "memory" and insert --transistor--.
In claim 36, column 24, line 41, please delete "memory" and insert --transistor--.
In claim 37, column 24, line 52, please delete "memory" and insert --transistor--.